(12) United States Patent
Shimizu et al.

(10) Patent No.: US 10,006,805 B2
(45) Date of Patent: Jun. 26, 2018

(54) LIGHT RECEIVER AND MOBILE ELECTRONIC DEVICE

(71) Applicant: Sharp Kabushiki Kaisha, Osaka (JP)

(72) Inventors: Takayuki Shimizu, Osaka (JP); Takahiro Inoue, Osaka (JP); Hideki Sato, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 128 days.

(21) Appl. No.: 15/115,721

(22) PCT Filed: Feb. 24, 2015

(86) PCT No.: PCT/JP2015/055152
§ 371 (c)(1),
(2) Date: Aug. 1, 2016

(87) PCT Pub. No.: WO2015/151651
PCT Pub. Date: Oct. 8, 2015

(65) Prior Publication Data
US 2017/0138786 A1    May 18, 2017

(30) Foreign Application Priority Data

Apr. 4, 2014  (JP) .................................. 2014-078143

(51) Int. Cl.
*H01L 27/14* (2006.01)
*G01J 1/04* (2006.01)
(Continued)

(52) U.S. Cl.
CPC ............. *G01J 1/0407* (2013.01); *G01J 1/429* (2013.01); *G01J 1/44* (2013.01);
(Continued)

(58) Field of Classification Search
CPC .. G01J 1/0407; G01J 1/44; G01J 1/429; G01J 2001/446; H01L 31/1013; H01L 31/02162;
(Continued)

(56) References Cited

U.S. PATENT DOCUMENTS

| 5,130,776 A | 7/1992 | Popovic |
| 8,294,231 B2 | 10/2012 | Kawai |

(Continued)

FOREIGN PATENT DOCUMENTS

| JP | H02278883 A | 11/1990 |
| JP | 2006071581 A | 3/2006 |

(Continued)

OTHER PUBLICATIONS

International Search Report of PCT/JP2015/055152 dated May 26, 2015.

*Primary Examiner* — Tony Ko
(74) *Attorney, Agent, or Firm* — Birch, Stewart, Kolasch & Birch, LLP

(57) ABSTRACT

A light receiver capable of detecting the intensity of light in a certain wavelength range is provided. The light receiver includes a first light receiving element (PD1) and a second light receiving element (PD2) that have an identical spectral sensitivity characteristic, and a UV cut filter (11). Light that has passed through the UV cut filter (11) enters the first light receiving element (PD1). A subtractor is provided that calculates a difference between a photocurrent of the first light receiving element (PD1) and a photocurrent of the second light receiving element (PD2).

4 Claims, 22 Drawing Sheets

(51) Int. Cl.
*G01J 1/42* (2006.01)
*G01J 1/44* (2006.01)
*H01L 27/146* (2006.01)
*H01L 31/0216* (2014.01)
*H01L 31/101* (2006.01)

(52) U.S. Cl.
CPC .. *H01L 27/14621* (2013.01); *H01L 27/14623* (2013.01); *H01L 27/14647* (2013.01); *H01L 31/02162* (2013.01); *H01L 31/1013* (2013.01); *G01J 2001/446* (2013.01)

(58) Field of Classification Search
CPC ......... H01L 27/14647; H01L 27/14621; H01L 27/14623
See application file for complete search history.

(56) References Cited

U.S. PATENT DOCUMENTS

| | | |
|---|---|---|
| 2009/0243019 A1 | 10/2009 | Kawai |
| 2013/0050068 A1 | 2/2013 | Inoue et al. |
| 2013/0256513 A1 | 10/2013 | Kitade |
| 2016/0109287 A1 | 4/2016 | Kitade |
| 2017/0256658 A1* | 9/2017 | Tsukagoshi ....... H01L 31/02162 |
| 2018/0077342 A1* | 3/2018 | Nakata ................... H04N 9/045 |

FOREIGN PATENT DOCUMENTS

| | | |
|---|---|---|
| JP | 2007067331 A | 3/2007 |
| JP | 2009239003 A | 10/2009 |
| JP | 2010112714 A | 5/2010 |
| JP | 2013-50422 A | 3/2013 |
| JP | 2014-112048 A | 6/2013 |
| JP | 2013197243 A | 9/2013 |

* cited by examiner

310: LIGHT RECEIVING PART

FIRST LIGHT RECEIVING ELEMENT : PD1     PD2 : SECOND LIGHT RECEIVING ELEMENT

THIRD LIGHT RECEIVING ELEMENT : PD3     PD4 : FOURTH LIGHT RECEIVING ELEMENT

LIGHT RECEIVER AND MOBILE ELECTRONIC DEVICE

TECHNICAL FIELD

The present invention relates to a light receiver and a mobile electronic device.

BACKGROUND ART

In recent years, with continuing size reduction of cameras, proximity sensors, direction sensors, acceleration sensors, angular velocity sensors, illuminance sensors, and so forth, these various sensors have been mounted on mobile electronic devices such as smart phones. In electronic devices with liquid crystal panels in particular, an illuminance sensor measures the surrounding brightness, and the brightness of a backlight is adjustable in accordance with the surrounding brightness. The following technology is known to realize illuminance measurement in spectral sensitivity characteristics near luminosity. That is, a plurality of photodiodes with different spectral sensitivity characteristics are provided in an illuminance sensor, and photocurrents of the photodiodes are calculated.

FIG. 24 is a cross sectional view of an optical sensor of the related art. FIG. 25 is a diagram illustrating the spectral sensitivity characteristics of the optical sensor illustrated in FIG. 24. As illustrated in FIG. 24, the optical sensor includes two light receiving elements (PD1 and PD2) with different spectral sensitivities. The light receiving element PD1 and the light receiving element PD2 each have a three-layer structure including a p-type diffusion layer (P+), an n-type well layer (N-Well), and a p-type substrate (P-Sub), and have two photodiodes (PD_vis and PD_ir) having PN junctions. In the light receiving element PD1, the P+ layer and the P-Sub are grounded. In the light receiving element PD2, the P-sub is grounded, and the P+ layer and the N-Well layer are connected to each other.

Accordingly, as illustrated in FIG. 25, the spectral-response characteristic PD_clear (PD_vis+PD_ir) is obtained by the light receiving element PD1, and the spectral-response characteristic PD_ir is obtained by the light receiving element PD2. When PD1 (PD_clear)−PD2 (PD_ir) is calculated, a spectral-response characteristic corresponding to PD_vis is obtained, which is a characteristic whose peak sensitivity is close to luminosity, and accordingly illuminance can be measured.

Watch-type terminals and glasses-type mobile electronic devices have also been put to practical use as sub terminals for smart phones. This provides an environment where a person wearing such a device can monitor his/her biometrics information such as the heart rate and the amount of exercise, which enables the wearer to manage himself/herself. Furthermore, an ultraviolent sensor may be provided in such a mobile electronic device used outdoors. The ultraviolet sensor measures the intensity of ultraviolet rays included in sun light, thereby prompting the user to protect against sunburn or recording the integrated quantity of ultraviolet rays received during day. Accordingly, the use of such a mobile electronic device enables management of the user's health information. It is preferable that the device have the function of detecting, in addition to illuminance, the intensity of light in a certain wavelength range, such as the ultraviolet range.

For example, PTL 1 describes an ultraviolet measurement device with an UV sensor and an illuminance sensor. The ultraviolet measurement device described in PTL 1 determines whether the device is in an environment where ultraviolet measurement is possible, on the basis of the output of the illuminance sensor, and, when it is determined that the environment allows ultraviolet measurement, the ultraviolet radiation dose is measured using the UV sensor. Accordingly, the accurate ultraviolet radiation dose can be measured.

The device described in PTL 1 is for accurately measuring ultraviolet rays. Since a cover member that only allows ultraviolet rays to pass through is provided above the illuminance sensor, the illuminance cannot be accurately measured. To measure the illuminance, a sensor window for the illuminance sensor must be additionally provided.

In a mobile electronic device that has an illuminance sensor and an ultraviolet sensor, an attempt has been made to employ a common sensor window for the ultraviolet sensor and the illuminance sensor in order to improve the design while making the number of optical sensor windows as few as possible.

PTL 2 describes an optical sensor that integrates a visible light sensor and an ultraviolet sensor on one SOI substrate. According to the optical sensor described in PTL 2, the ultraviolet intensity and the illuminance can be measured while reducing the area where the sensors are mounted.

CITATION LIST

PTL

PTL 1: Japanese Unexamined Patent Application Publication No. 2010-112714 (published on May 20, 2010)

PTL 2: Japanese Patent No. 5189391 (registered on Feb. 1, 2013)

SUMMARY OF INVENTION

Technical Problem

The visible light sensor and the ultraviolet sensor used in the optical sensor described in PTL 2 have different cross-sectional structures (multilayer structures). Like PTL 2, it is not easy to integrate a visible light sensor and an ultraviolet sensor that have different cross-sectional structures on one SOI substrate, and, as a result, the manufacturing cost increases.

In view of the foregoing problems, it is an object of the present invention to provide an inexpensive light receiver capable of detecting the intensity of light in a certain wavelength range and a mobile electronic device with the light receiver.

Solution to Problem

In order to solve the above-described problems, a light receiver according to an aspect of the present invention includes a light receiving element that allows a photocurrent to flow in response to reception of light, and a detector that detects intensity of the light on the basis of the photocurrent. As the light receiving element, a first light receiving element and a second light receiving element are provided that are arranged adjacent to each other, and that have an identical spectral sensitivity characteristic. An optical filter is provided whose transmittance of light in a certain wavelength range is lower than transmittance of light in ranges other than the certain wavelength range. Light that has passed through the optical filter enters the first light receiving element, and the detector includes an arithmetic operation unit that calculates a difference between a photocurrent of the first light receiving element and a photocurrent of the second light receiving element.

Advantageous Effects of Invention

According to the aspect of the present invention, an inexpensive light receiver capable of detecting the intensity of light in a certain wavelength range can be provided.

DESCRIPTION OF EMBODIMENTS

First Embodiment

Hereinafter, an embodiment of the present invention will be described in detail on the basis of FIGS. 1 to 9.

Figure 3:
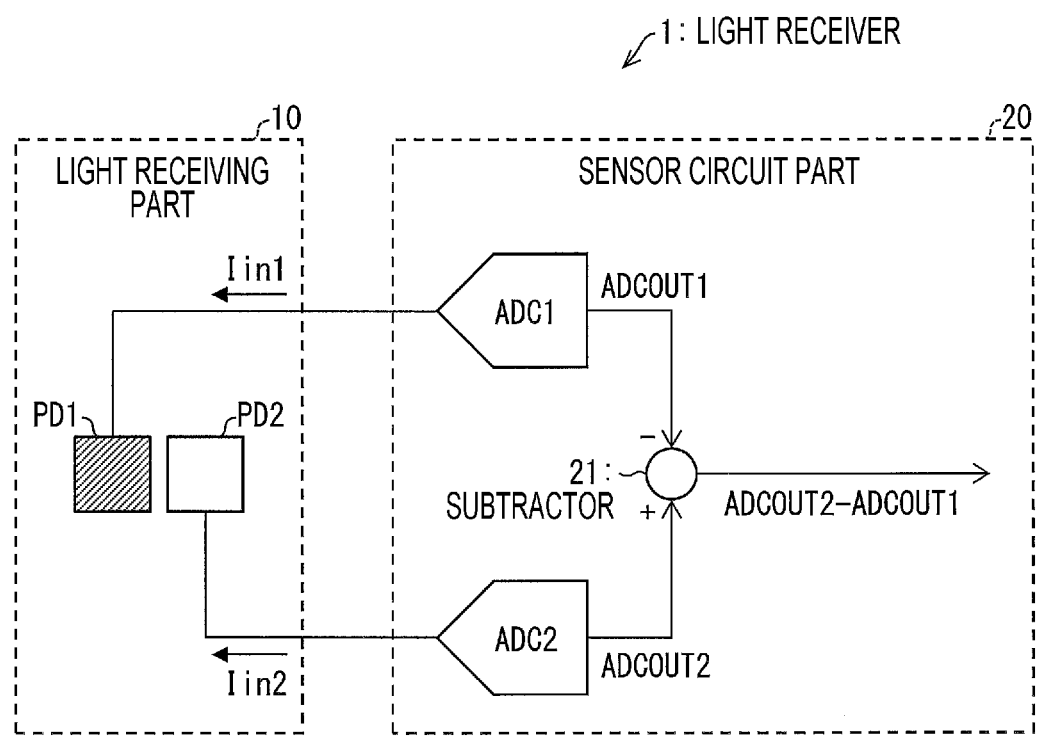
FIG. 3 is a block diagram illustrating the configuration of the light receiver according to the first embodiment.

FIG. 3 is a block diagram illustrating the configuration of a light receiver according to the present embodiment. A light receiver 1 includes a light receiving part 10 that allows a photocurrent to flow in response to reception of light, and a sensor circuit part 20 (detector) that detects the intensity of the light on the basis of the photocurrent. The light receiver 1 can be mounted on a mobile electronic device such as a smart phone.

<Light Receiving Part>

Figure 2:
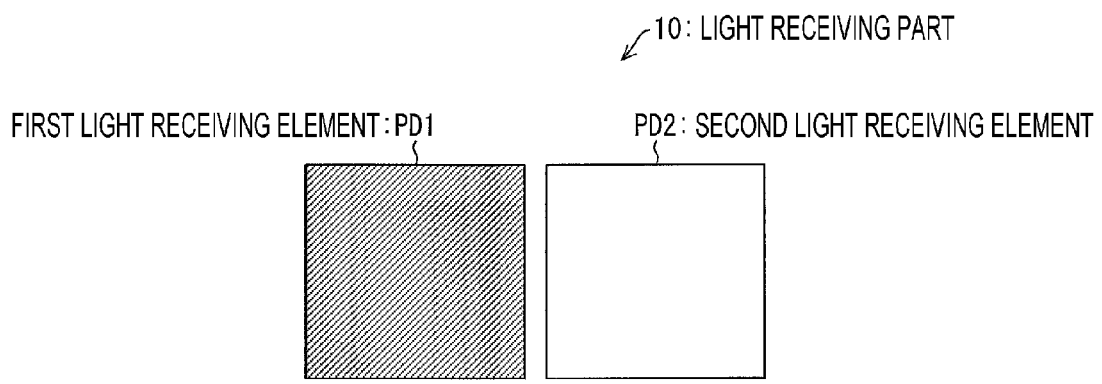
FIG. 2 is a plan view of the light receiving part of the light receiver according to the first embodiment.

FIG. 2 is a plan view of the light receiving part of the light receiver according to the present embodiment. The light receiving part 10 includes a first light receiving element PD1 and a second light receiving element PD2 arranged adjacent to each other when viewed in plan. The first light receiving element PD1 allows a photocurrent Iin1 to flow in accordance with the intensity of received light, and the second light receiving element PD2 allows a photocurrent Iin2 to flow in accordance with the intensity of received light.

Figure 1:
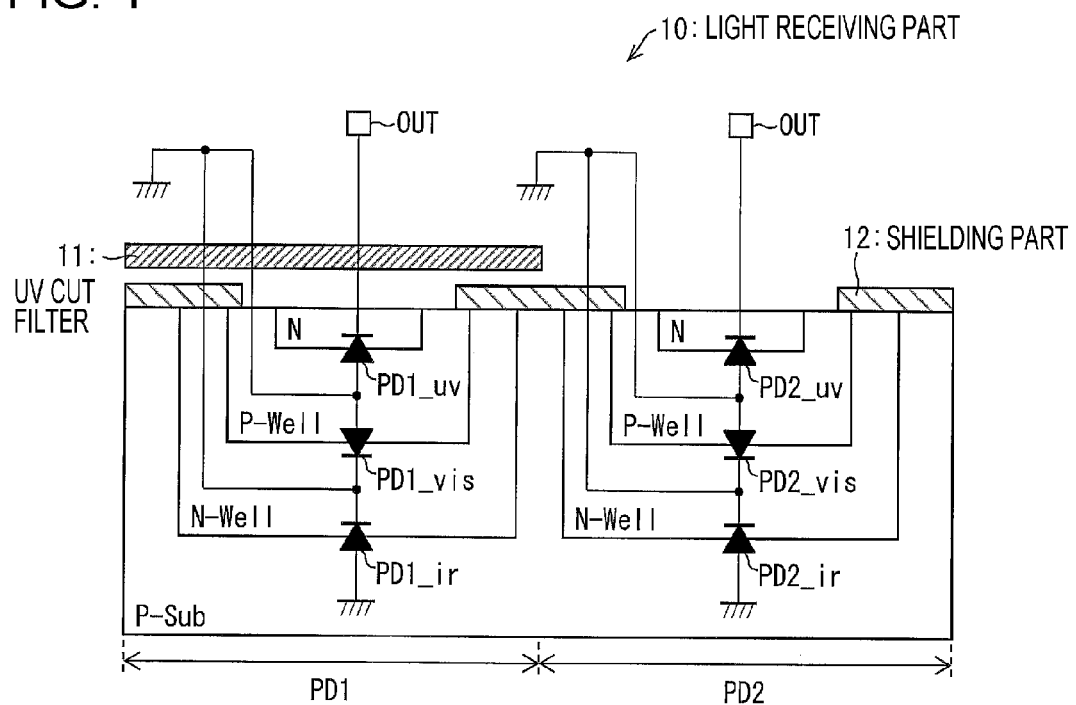
FIG. 1 is a cross sectional view of a light receiving part of a light receiver according to a first embodiment of the present invention.

FIG. 1 is a cross sectional view of the light receiving part of the light receiver according to the present embodiment. As illustrated in FIG. 1, the light receiving part 10 includes the first light receiving element PD1, the second light receiving element PD2, and an UV cut filter 11 (ultraviolet cut filter) provided above the first light receiving element PD1. Accordingly, light that has passed through the UV cut filter 11 enters the first light receiving element PD1.

The first light receiving element PD1 and the second light receiving element PD2 have the same cross sectional structure. That is, the first light receiving element PD1 and the second light receiving element PD2 each have a p-type substrate P_sub, an n-type well layer N_well formed on the p-type substrate P_sub, a p-type well layer P_well formed on the n-type well layer N_well, and an n-type diffusion layer N formed on the p-type well layer P_well. The p-type well layer, n-type well layer, and p-type substrate are grounded (GND). The n-type diffusion layer is connected to an output terminal OUT at a potential higher than the ground.

The first light receiving element PD1 has three PN junctions. The first light receiving element PD1 includes a photodiode PD1_ir configured by a PN junction between the p-type substrate and the n-type well layer, a photodiode PD1_vis configured by a PN junction between the n-type well layer and the p-type well layer, and a photodiode PD1_uv configured by a PN junction between the p-type well layer and the n-type diffusion layer.

The second light receiving element PD2 has three PN junctions. The second light receiving element PD2 includes a photodiode PD2_ir configured by a PN junction between the p-type substrate and the n-type well layer, a photodiode PD2_vis configured by a PN junction between the n-type well layer and the p-type well layer, and a photodiode PD2_uv configured by a PN junction between the p-type well layer and the n-type diffusion layer.

The UV cut filter 11 is an optical filter whose transmittance of light in the ultraviolet wavelength range (wavelength less than or equal to 400 nm) is lower than the transmittance of light in ranges other than the ultraviolet wavelength range. It is preferable that the UV cut filter 11 be configured to cut off light in the ultraviolet wavelength range.

Shielding parts 12 are provided on top surfaces of the first light receiving element PD1 and the second light receiving element PD2 so as to expose the n-type diffusion layers. Accordingly, external light enters the n-type diffusion layers.

<Sensor Circuit Part>

As illustrated in FIG. 3, the sensor circuit part 20 includes an A/D converter ADC1, an A/D converter ADC2, and a subtractor 21 (arithmetic operation unit).

The A/D converter ADC1 is connected to the first light receiving element PD1. The A/D converter ADC1 converts the photocurrent Iin1 to a digital signal and outputs a digital output value ADCOUNT1. The digital output value ADCOUNT1 corresponds to the intensity of light entering the first light receiving element PD1.

The A/D converter ADC2 is connected to the second light receiving element PD2. The A/D converter ADC2 converts the photocurrent Iin2 to a digital signal and outputs a digital output value ADCOUNT2. The digital output value ADCOUNT2 corresponds to the intensity of light entering the second light receiving element PD2.

The subtractor 21 calculates and outputs a difference (ADCOUNT2−ADCOUNT1) between the digital output value ADCOUNT2 and the digital output value ADCOUNT1. The difference is obtained by subtracting the intensity of light entering the first light receiving element PD1 from the intensity of light entering the second light receiving element PD2.

(A/D Converter)

The A/D converters ADC1 and ADC2 have the same configuration. The configuration of the A/D converter ADC (ADC1 and ADC2) will be described with reference to FIG. 4.

Figure 4:
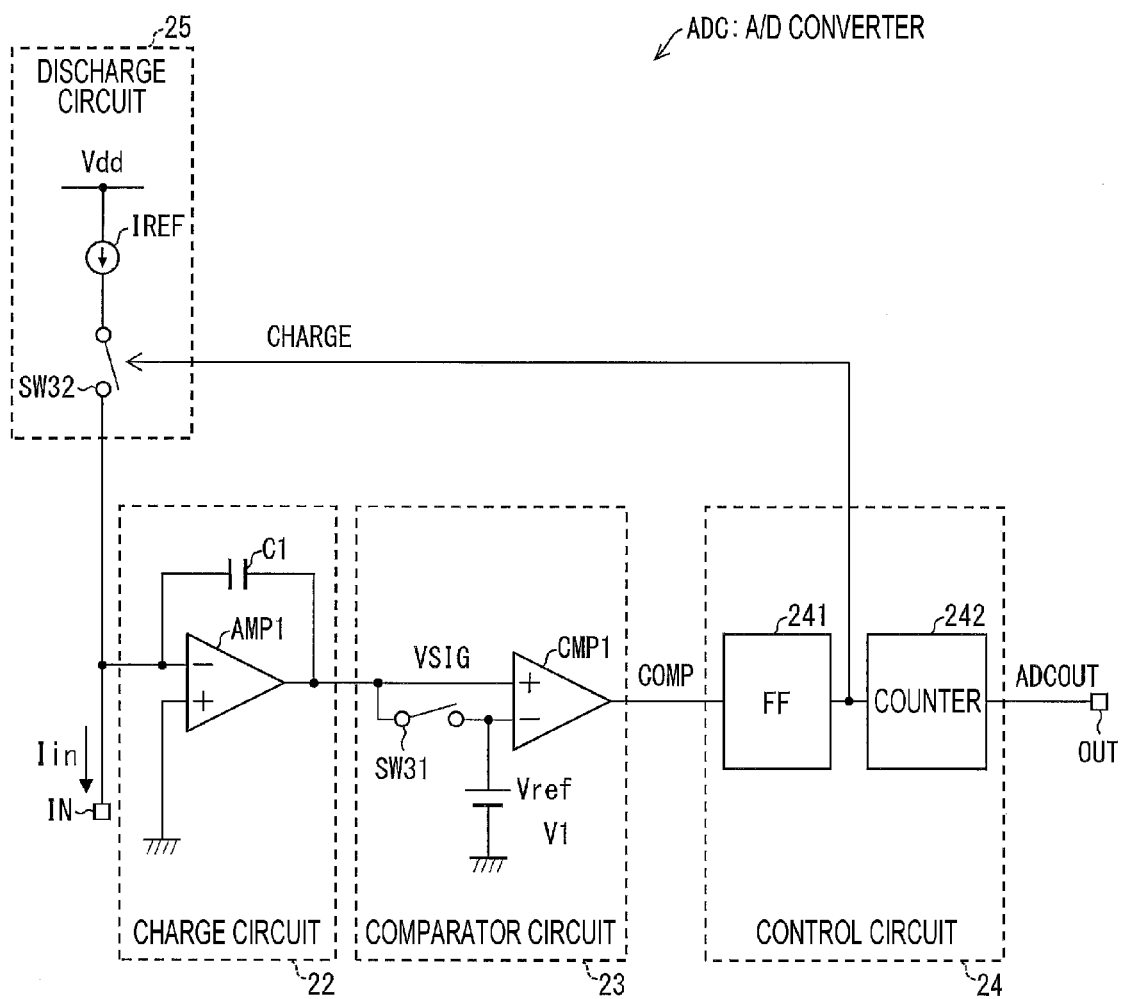
FIG. 4 is a block diagram illustrating the configuration of an A/D converter.

FIG. 4 is a block diagram illustrating the configuration of the A/D converter.

As illustrated in FIG. 4, the A/D converter ADC includes an input terminal IN, an output terminal OUT, a charge circuit 22, a comparator circuit 23, a control circuit 24, and a discharge circuit 25.

The charge circuit 22 is a circuit charged with the photocurrent Iin, and includes an amplifier circuit AMP1 and a capacitor C1 that accumulates electric charge in accordance with the photocurrent Iin. The amplifier circuit AMP1 has an inverting input terminal connected to the input terminal IN, a non-inverting input terminal connected to the ground (0 V), and an output terminal connected to the comparator circuit 23. The capacitor C1 is provided between the inverting input terminal and the output terminal of the amplifier circuit AMP1. Accordingly, the amplifier circuit AMP1 and the capacitor C1 configure an integrating circuit.

The comparator circuit 23 is a circuit that compares the output voltage of the charge circuit with a reference voltage (V1), and includes a comparator CMP1, a switch SW31, and a reference power supply V1. The comparator CMP1 has a non-inverting input terminal connected to the charge circuit 22, an inverting input terminal connected to the charge circuit 22 via the switch SW31 and to the reference power supply V1, and an output terminal connected to the control circuit 24. The switch SW31 is opened/closed (on/off) in response to a switching signal from the outside, and establishes/terminates an electric connection of the charge circuit 22 with the non-inverting input terminal of the comparator CMP1 and the reference voltage (V1). The reference power supply V1 applies a reference voltage Vref to the inverting input terminal of the comparator CMP1.

The control circuit 24 counts the number of times the discharge circuit 25 performs discharge within a measurement time, on the basis of the output (comparison result) of the comparator circuit 23, and outputs a digital value in accordance with the number of times. The control circuit 24 includes a flip-flop (FF) 241 and a counter 242. The FF 241 has an input part connected to the comparator circuit 23 and an output part connected to the counter 242 and to the discharge circuit 25. The output part of the counter 242 is connected to the output terminal OUT.

The discharge circuit 25 causes the charge circuit 22 to discharge when the output voltage of the charge circuit 22 exceeds the reference voltage Vref (discharges the electric charge accumulated in the capacitor C1), and includes a current source IREF and a switch SW32. The switch SW32 has one terminal connected to the current source IREF and another terminal connected to the charge circuit 22 and the input terminal IN. The switch SW32 is opened/closed (on/off) in response to a switching signal (an output signal CHARGE of the FF 241) and establishes/terminates an electric connection between the two.

(Operation of A/D Converter)

Figure 5:
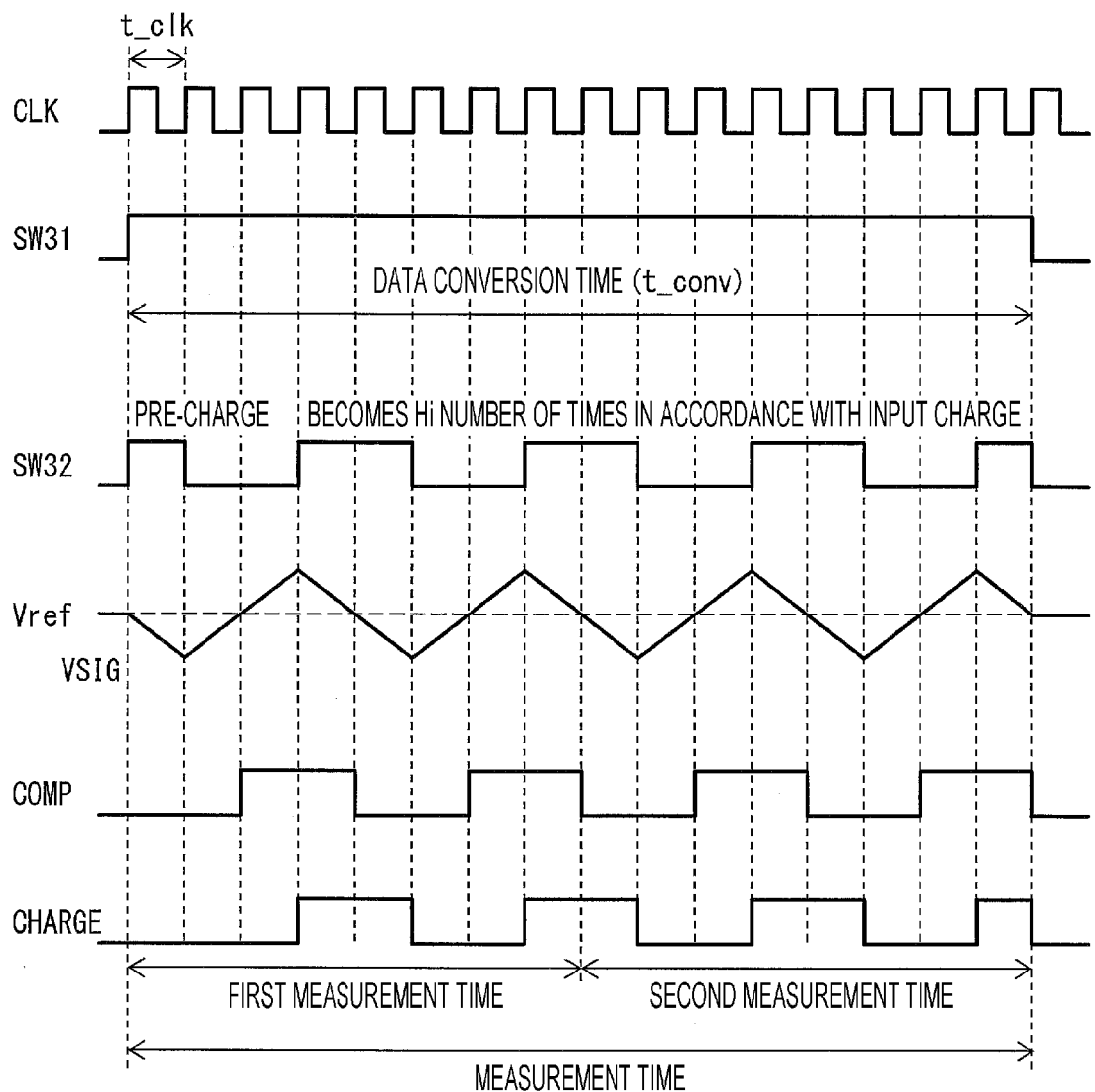
FIG. 5 is a timing chart illustrating an example of the operation of the A/D converter.

FIG. 5 is a timing chart illustrating an example of the operation of the A/D converter. In FIG. 5, CLK denotes a clock signal; SW31 denotes the open/closed state of the switch SW31; SW32 denotes the open/closed state of the switch SW32; Vref denotes the voltage of the reference power supply V1; VSIG denotes the output of the charge circuit 22; COMP denotes the output of the comparator circuit 23; and CHARGE denotes the output of the control circuit 24 used in opening/closing the switch SW32.

The switch SW31 is closed before the start of a conversion operation. Accordingly, the output VSIG of the charge circuit 22 (integrating circuit) is charged to the voltage Vref of the reference power supply V1.

The A/D converter becomes able to charge the capacitor C1 with the photocurrent Iin when the switch SW31 opens, thereby performing an AD conversion operation. The open period of the switch SW31 is a data conversion period (charge period, t_conv), which corresponds to a measurement time.

In the data conversion period, the switch SW32 is firstly turned on, and the discharge circuit 25 discharges a certain electric charge (IREF×t_clk) from the capacitor C1 (precharge operation). Next, when the switch SW32 is switched from on to off, the photocurrent Iin from the light receiving element PD charges the charge circuit 22, and the output VSIG of the charge circuit 22 rises. When the output VSIG exceeds the voltage Vref, the output COMP of the comparator circuit 23 changes from a low voltage to a high voltage. Accordingly, the output of the FF 241, that is, the output CHARGE of the control circuit 24, changes from a low voltage to a high voltage, the switch SW32 is turned on, and the discharge circuit 25 discharges the certain electric charge (IREF×t_clk).

Next, this discharge causes the output VSIG of the charge circuit 22 to fall, and, when the output VSIG falls below the voltage Vref, the output COMP of the comparator circuit 23 changes from a high voltage to a low voltage. Accordingly, the output of the FF 241, that is, the output CHARGE of the control circuit 24, changes from a high voltage to a low voltage, the switch SW32 is turned off, and the discharge stops.

Thereafter, the photocurrent Iin from the light receiving element PD again charges the charge circuit 22, and the same operation as above is performed.

Meanwhile, during the data conversion period (t cony), the counter 242 counts the times at which the output of the FF 241 becomes a high voltage, that is, the number of discharge times, and this count value is output as a digital value in accordance with the input electric charge amount. The output of the counter 242 becomes the output ADCOUNT of the A/D converter ADC.

The A/D converter ADC operates such that the amount of electric charge charged by the photocurrent Iin becomes equal to the amount of electric charge discharged by (IREF×t_clk). Thus, the following equation holds true on the basis of "the amount of charged electric charge (Iin×t_conv)=the amount of discharged electric charge (IREF×t_clk×count)".

$$count=(Iin \times t\_conv)/(IREF \times t\_clk)$$

count: count value of discharge times;
Iin: input current value;
IREF: reference current value;
t_conv: charge time; and
t_clk: clock cycle.

Thus, it is clear that the minimum resolving power of the count value of discharge times (count) is determined by (IREF×t_clk).

<Ultraviolet Intensity Measurement>

Next, the principle of detecting the ultraviolet intensity using the light receiver 1 will be described.

Figure 6:
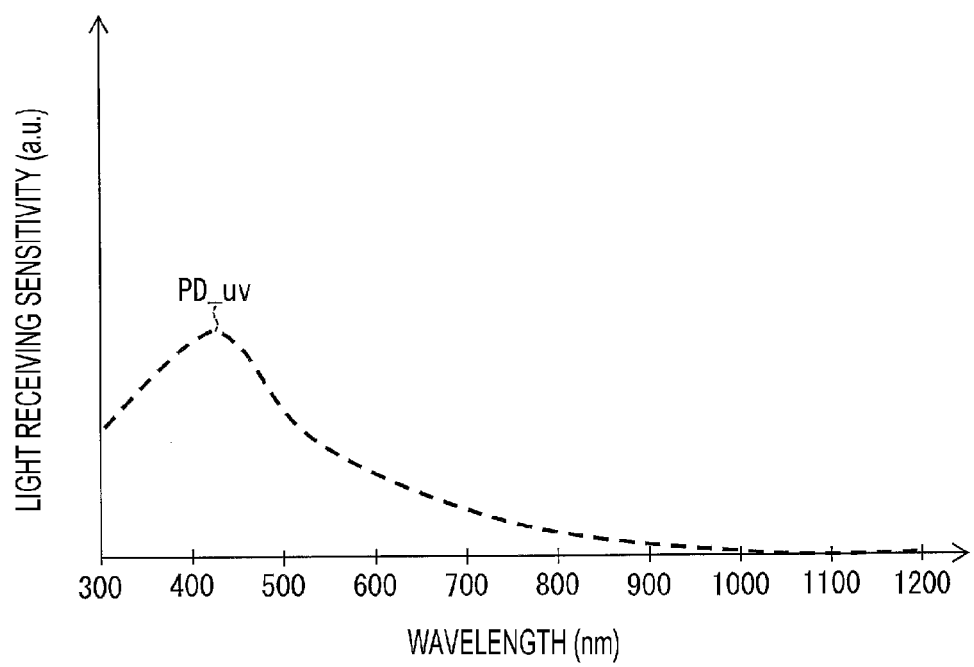
FIG. 6 is a diagram illustrating the spectral sensitivity characteristic of a photodiode PD_uv.

FIG. 6 is a diagram illustrating the spectral sensitivity characteristic of the photodiode PD_uv. As illustrated in FIG. 6, the peak wavelength of the spectral sensitivity characteristic of the photodiode PD_uv is about 450 nm. Note that this peak wavelength is adjustable by adjusting the junction depth of the PN junction in the light receiving element.

Also, the first light receiving element PD1 and the second light receiving element PD2 which have the photodiode PD_uv have a sensitivity in the ultraviolet wavelength range.

Figure 7:
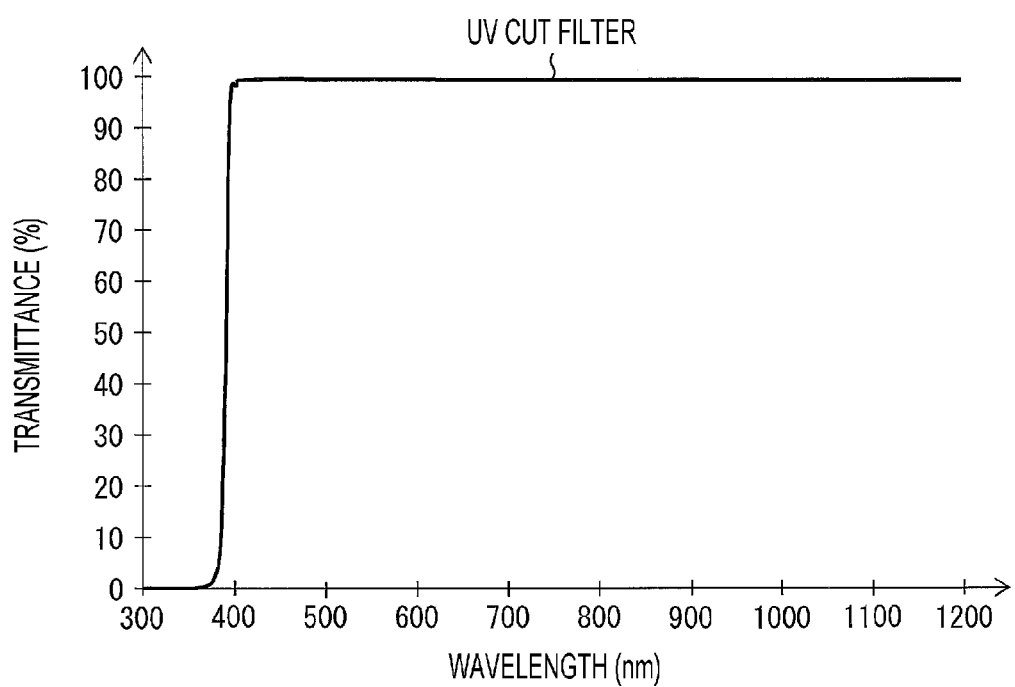
FIG. 7 is a diagram illustrating the spectral transmittance characteristic of an UV cut filter.

FIG. 7 is a diagram illustrating the spectral transmittance characteristic of the UV cut filter. The UV cut filter 11 has a low transmittance for light of wavelength 400 nm or less, and has about a 100% transmittance for light of wavelength 400 nm or more.

Figure 8:
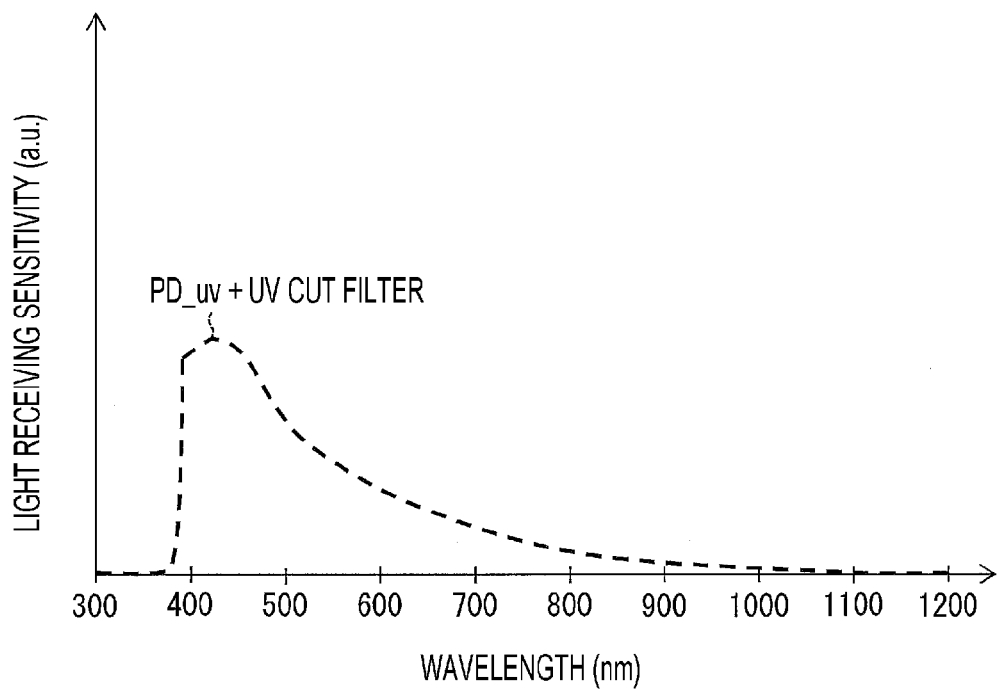
FIG. 8 is a diagram illustrating the spectral sensitivity characteristic of the photodiode PD_uv relative to light passing through the UV cut filter according to the first embodiment.

FIG. 8 is a diagram illustrating the spectral sensitivity characteristic of the photodiode PD_uv relative to light passing through the UV cut filter according to the first embodiment.

In the light receiving part 10 of the light receiver 1, the UV cut filter 11 is provided above the first light receiving element PD1, and light that has passed through the UV cut filter 11 enters the first light receiving element PD1.

Therefore, the spectral sensitivity characteristic of the first light receiving element PD1 becomes the spectral sensitivity characteristic illustrated in FIG. 8. In contrast, the UV cut filter 11 is not provided above the second light receiving element PD2, and accordingly the spectral sensitivity characteristic of the second light receiving element PD2 becomes the spectral sensitivity characteristic illustrated in FIG. 6.

In the sensor circuit part 20 of the light receiver 1, the subtractor 21 calculates the difference between the digital output value ADCOUNT2 and the digital output value ADCOUNT1.

The difference obtained by the calculation performed by the subtractor 21 is equal to the result of subtracting the intensity of light entering the first light receiving element PD1 from the intensity of light entering the second light receiving element PD2. Therefore, the spectral sensitivity characteristic of the entire light receiving part 10 can be regarded as the spectral sensitivity characteristic illustrated in FIG. 9.

Accordingly, the light receiving part 10 has a sensitivity only in the ultraviolet range where the wavelength is 400 nm or less, and the light receiver 1 can accurately measure the ultraviolet intensity.

According to the light receiver 1 of the present embodiment, because the first light receiving element PD1 and the second light receiving element PD2 which have the same multilayer structure are used, the manufacturing steps become simpler and the cost can be reduced.

Although only the photodiode PD_uv having a PN junction on the outermost surface is used in order to measure the ultraviolet intensity in the light receiver 1, the illuminance may be measured by using the photodiode PD_vis and the photodiode PD_ir having other PN junctions.

Reference Example

In a light receiver of the related art, a photodiode using a compound semiconductor such as GaN-based or ZnO-based or an SOI substrate has been used in order to measure the ultraviolet intensity. Therefore, it has been difficult to integrate the photodiode with a signal processing IC on the same IC chip, which results in a higher cost.

To measure the ultraviolet intensity using a light receiver with a filter that allows light in the ultraviolet range to pass through, for example, it is difficult to completely have a zero sensitivity at wavelength 400 nm or more. An interference film filter has a greater number of layers and thus a higher cost, compared with an UV cut filter. Furthermore, the sensitivity in the visible light range becomes lower because the filter which allows only ultraviolet rays to pass through is used. Therefore, to detect visible light in the wavelength range of 400 nm to 700 nm, it is necessary to prepare a photodiode that has a sensitivity in the visible light range, in addition to a photodiode for ultraviolet detection.

<Others>

Although the above description has discussed the configuration in which the light receiving part 10 includes the UV cut filter 11, the configuration is not limited to that described above. That is, the filter is not limited to the UV cut filter 11, and an optical filter (optical band eliminate filter) whose transmittance of light in a certain wavelength range is less than the transmittance of light in ranges other than that certain wavelength range may be used. In doing so, the intensity of light in the above-mentioned certain wavelength range can be accurately measured using the light receiver 1.

Second Embodiment

Another embodiment of the present invention will be described as follows on the basis of FIGS. 10 to 17. For the sake of description, members that have the same functions as those described in the above-described embodiment are given the same symbols, and descriptions thereof are omitted.

<Light Receiving Part>

Figure 10:
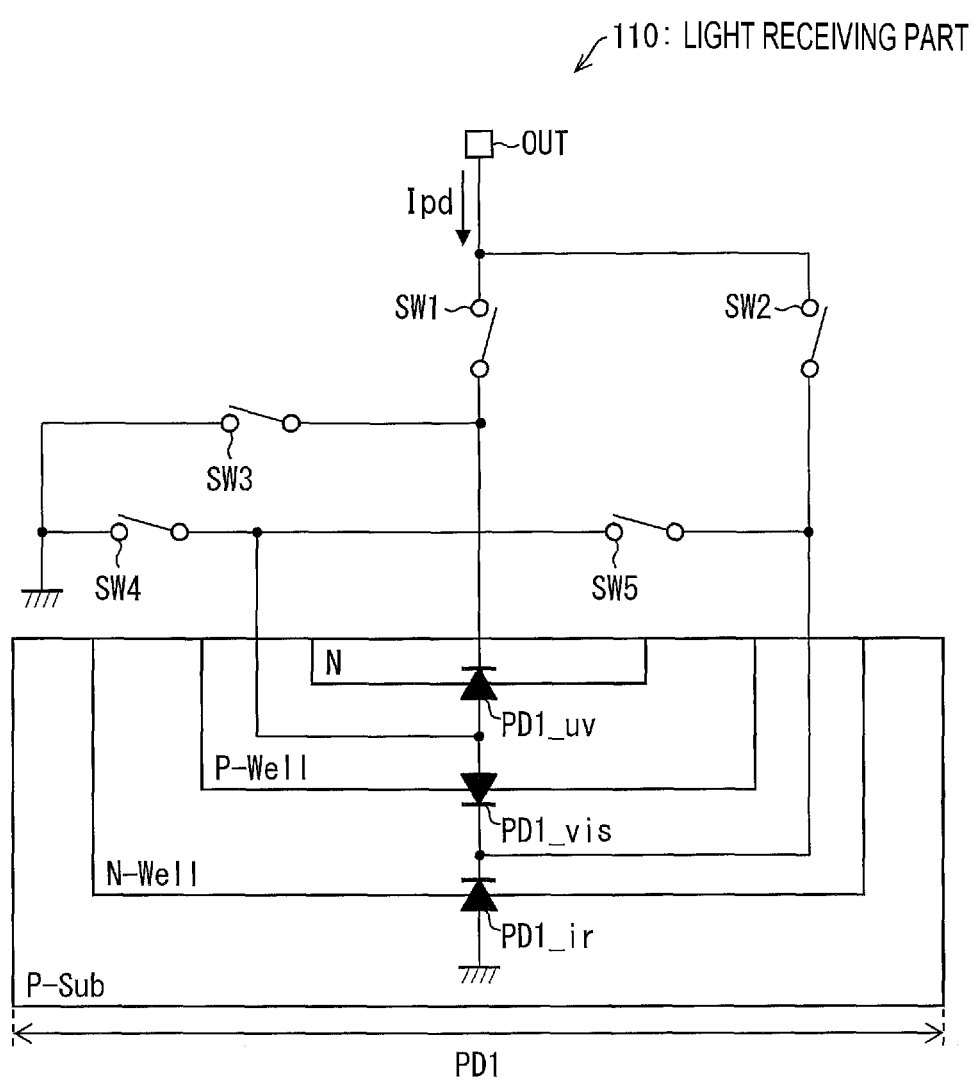
FIG. 10 is a cross sectional view of a first light receiving element of a light receiver according to a second embodiment of the present invention.

FIG. 10 is a cross sectional view of a first light receiving element of a light receiving part according to the present embodiment. A light receiving part 110 includes the first light receiving element PD1 and second light receiving element. Since the configuration of the second light receiving element is the same as that of the first light receiving element PD1, a description thereof is omitted. Like the light receiving part of the first embodiment, although a UV cut filter is provided above the first light receiving element PD, an illustration and detailed description thereof are omitted.

As illustrated in FIG. 10, the first light receiving element PD1 of the light receiving part 110 includes five switches SW1 to 5. The switches SW1 to SW1 are switches for changing the spectral sensitivity characteristics of the first light receiving element PD1 by changing the connection relationships among the layers of the first light receiving element PD1 (connection relationships among the anodes and cathodes of the photodiodes). A photocurrent of an arbitrary photodiode can be extracted by controlling the switches SW1 to 5.

The switch SW1 has one terminal connected to the output terminal OUT and another terminal connected to the n-type diffusion layer.

The switch SW2 has one terminal connected to the output terminal OUT and to one terminal of the switch SW1, and another terminal connected to the n-type well layer.

The switch SW3 has one terminal connected to GND and another terminal connected to the other terminal of the switch SW1 and the n-type diffusion layer.

The switch SW4 has one terminal connected to GND and one terminal of the switch SW3, and another terminal connected to the p-type well layer.

The switch SW5 has one terminal connected to the other terminal of the switch SW4 and the p-type well layer, and another terminal connected to the other terminal of the switch SW2 and the n-type well layer.

The opening/closing of the switches SW1 to 5 is controlled by an external controller (not illustrated).

Figure 11:
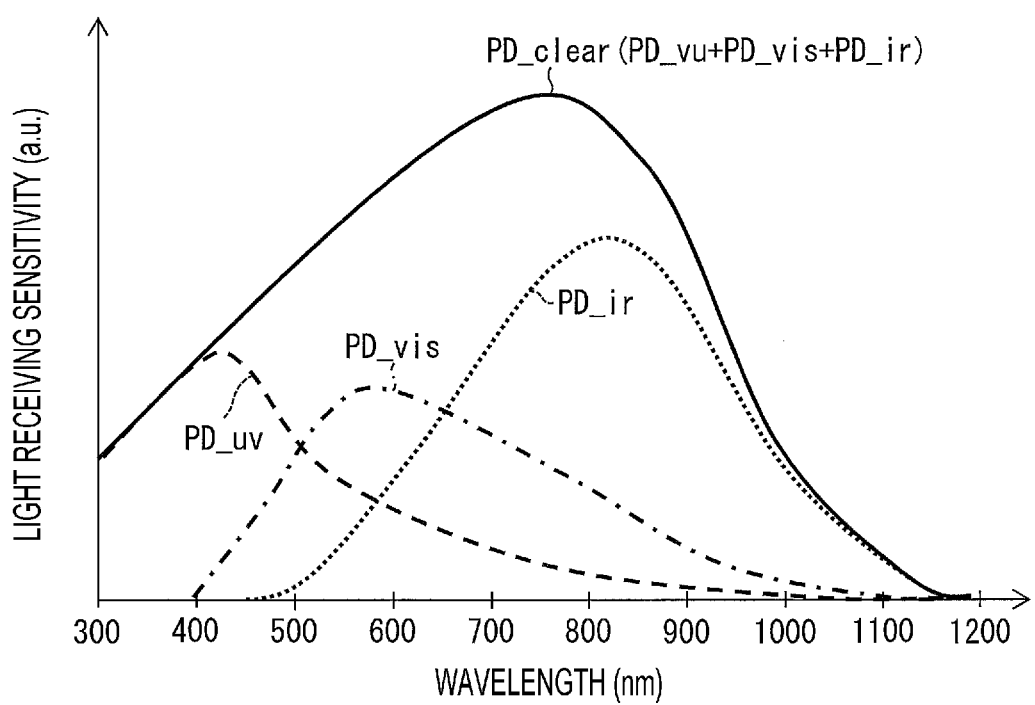
FIG. 11 is a diagram illustrating the spectral sensitivity characteristics of individual photodiodes of the first light receiving element.

FIG. 11 is a diagram illustrating the spectral sensitivity characteristics of individual photodiodes of the first light receiving element. PD_Clear in FIG. 11 indicates the sum of the spectral sensitivity characteristics of the photodiodes.

Figure 12:
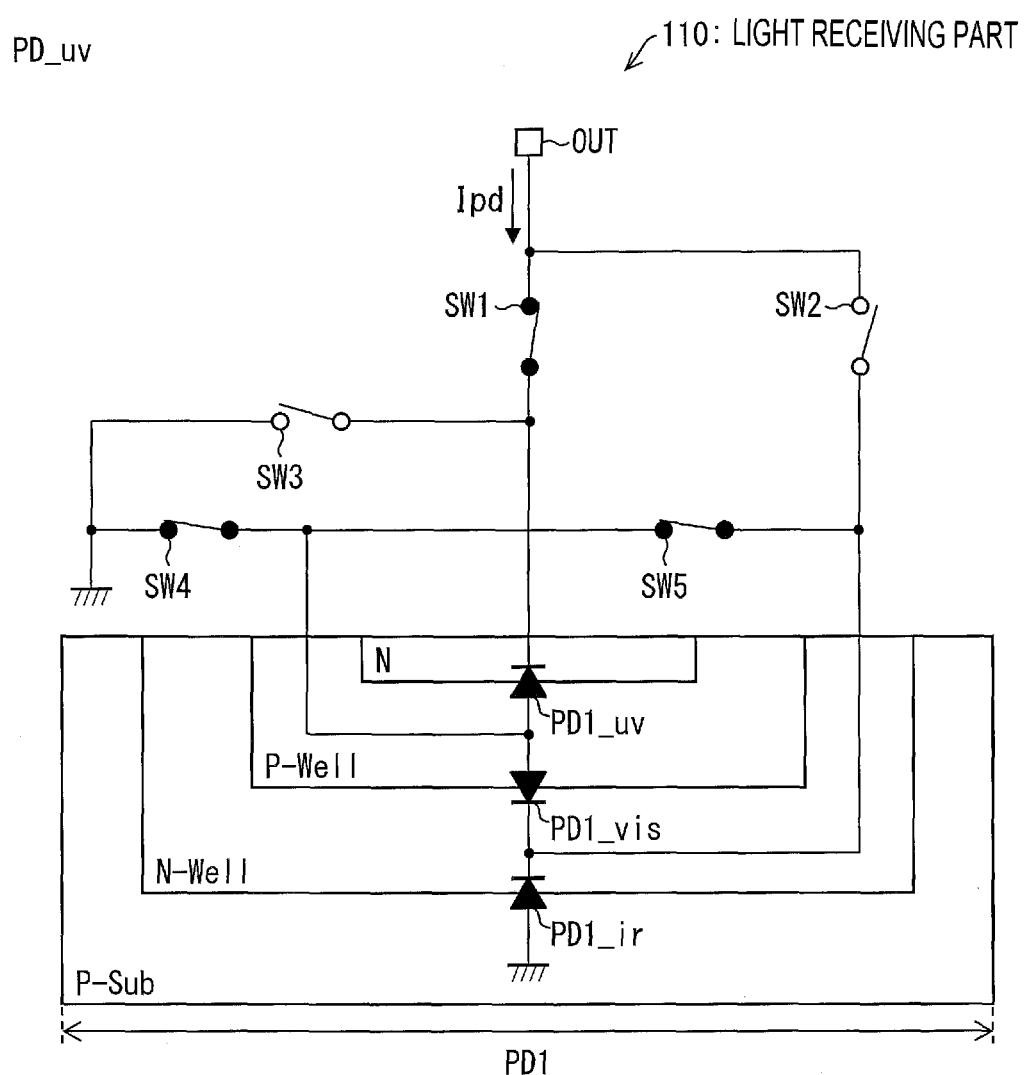
FIG. 12 is a cross sectional view of the first light receiving element indicating the open/closed state of switches when extracting a photocurrent of the photodiode PD_uv.

FIG. 12 is a cross sectional view of the first light receiving element indicating the open/closed state of the switches when extracting a photocurrent of the photodiode PD_uv. As illustrated in FIG. 12, the first light receiving element PD1 enters a state in which the first light receiving element PD1 has a sensitivity to light in the ultraviolet range by turning on the switches SW1, SW4, and SW5 and turning off the switches SW2 and SW3. At this time, the photocurrent of the photodiode PD_uv can be extracted from the first light receiving element PD1. The spectral sensitivity characteristic of the first light receiving element PD1 at this time becomes a curve denoted by PD_uv in FIG. 11.

Figure 13:
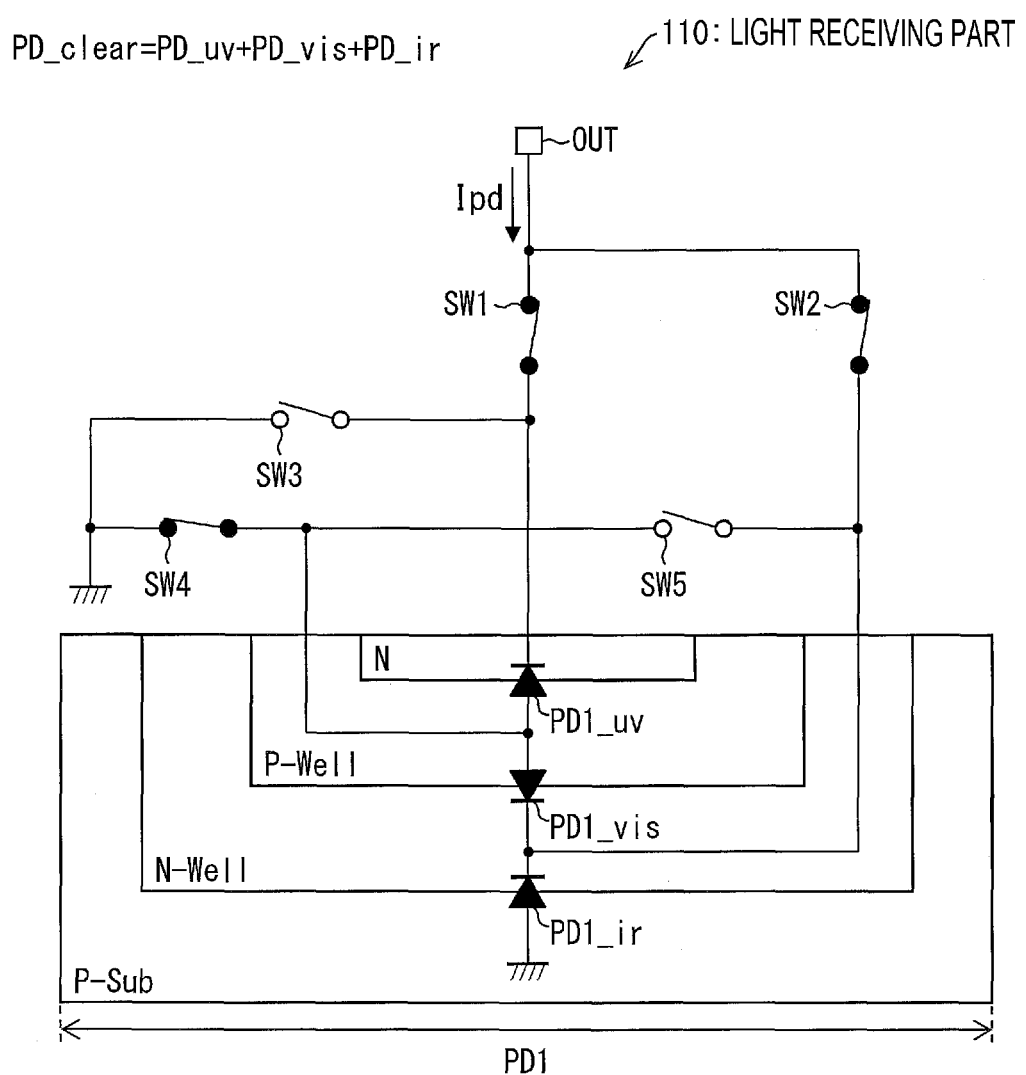
FIG. 13 is a cross sectional view of the first light receiving element indicating the open/closed state of the switches when extracting photocurrents of all the photodiodes.

FIG. 13 is a cross sectional view of the first light receiving element indicating the open/closed state of the switches when extracting photocurrents of all the photodiodes. As illustrated in FIG. 13, the first light receiving element PD1 enters a state (first state) in which the first light receiving element PD1 has a sensitivity to light in the ultraviolet range, visible light range, and infrared range by turning on the switches SW1, SW2, and SW4 and turning off the switches SW3 and SW5. At this time, the photocurrents of all the photodiodes (PD_uv, PD_vis, and PD_ir) can be extracted from the first light receiving element PD1. The spectral sensitivity characteristic of the first light receiving element PD1 at this time becomes a curve denoted by PD_clear in FIG. 11.

Figure 14:
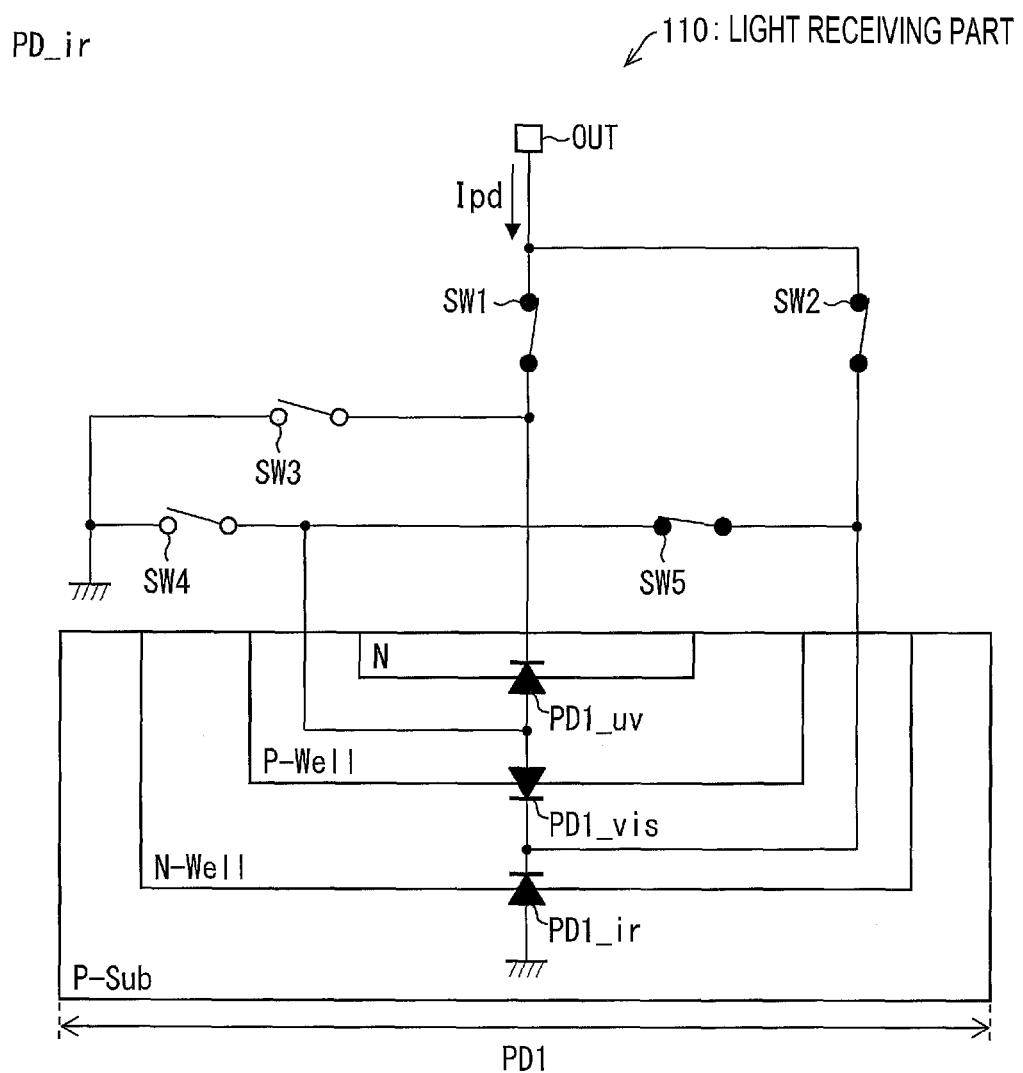
FIG. 14 is a cross sectional view of the first light receiving element indicating the open/closed state of the switches when extracting a photocurrent of the photodiode PD_ir.

FIG. 14 is a cross sectional view of the first light receiving element indicating the open/closed state of the switches when extracting a photocurrent of the photodiode PD_ir. As illustrated in FIG. 14, the first light receiving element PD1 enters a state (second state) in which the first light receiving element PD1 has a sensitivity to light in the infrared range by turning on the switches SW1, SW2, and SW5 and turning off the switches SW3 and SW4. At this time, the photocurrent of the photodiode PD_ir can be extracted from the first light receiving element PD1. The spectral sensitivity characteristic of the first light receiving element PD1 at this time becomes a curve denoted by PD_ir in FIG. 11.

Note that a digital output value corresponding to the photocurrent extracted from the photodiode PD_vis can be calculated by subtracting a digital output value obtained by converting the photocurrent extracted from the photodiode PD_uv and a digital output value obtained by converting the photocurrent extracted from the photodiode PD_ir from a digital output value obtained by converting the photocurrents extracted from all the photodiodes PD_clare (PD_uv, PD_vis, and PD_ir).

Therefore, the light intensity can be measured on the basis of the individual spectral sensitivity characteristics of the three photodiodes by controlling the opening/closing of the switches SW1 to 5 of the first light receiving element PD1.

<Ultraviolet Intensity Measurement>

Figure 15:
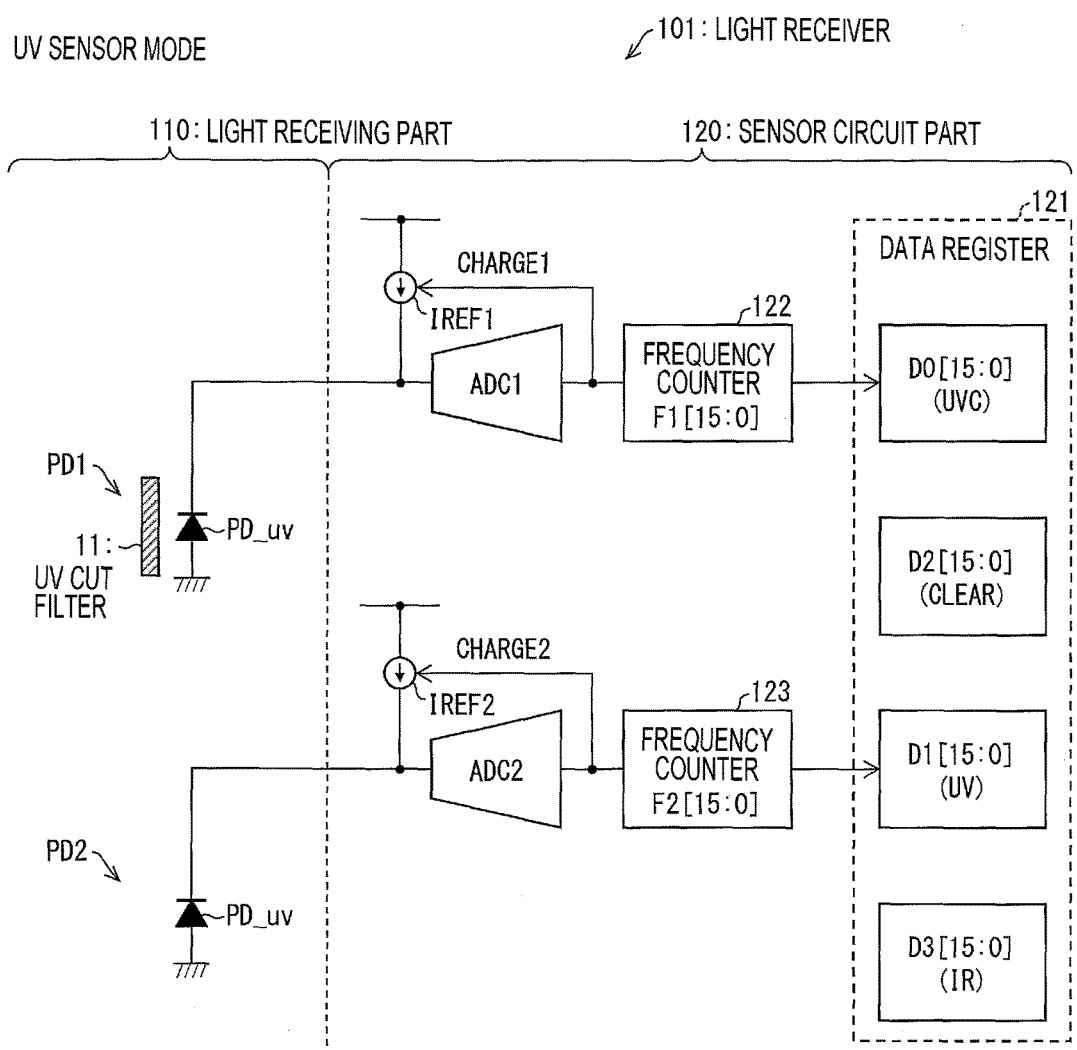
FIG. 15 is a block diagram illustrating the configuration of the light receiver according to the second embodiment, when measuring the ultraviolet intensity.

FIG. 15 is a block diagram illustrating the configuration of the light receiver according to the present embodiment, when measuring the ultraviolet intensity.

To measure the ultraviolet intensity, the switches SW1, SW4, and SW5 are turned on and the switches SW2 and SW3 are turned off in the first light receiving element PD1 and the second light receiving element PD2, as has been described with reference to FIG. 12.

The photocurrent extracted from the first light receiving element PD1 is input to the A/D converter ADC1, and the photocurrent extracted from the second light receiving element PD2 is input to the A/D converter ADC2. The A/D converters ADC1 and ADC2 perform current-to-pulse conversion.

A frequency counter 122 counts pulse strings in a preset period, and stores the count value in a first data register D0 of a data register 121.

A frequency counter 123 counts pulse strings in a preset period, and stores the count value in a third data register D1 of the data register 121.

Here, the above-mentioned count values are proportional to light intensity converted to spectral sensitivities of the individual light receiving elements (PD1 and PD2). Since the UV cut filter 11 is provided above the first light receiving element PD1, the spectral sensitivity characteristic of the first light receiving element PD1 becomes the spectral sensitivity characteristic illustrated in FIG. 8. In contrast, the spectral sensitivity characteristic of the second light receiving element PD2 becomes the spectral sensitivity characteristic illustrated in FIG. 6.

The digital-converted data (count value), which is proportional to the intensity of light entering the first light receiving element PD1, is stored in the first data register D0. In addition, the digital-converted data (count value), which is proportional to the intensity of light entering the second light receiving element PD2, is stored in the third data register D1.

Therefore, the ultraviolet intensity can be calculated by subtracting the count value (D1 [15:0]) stored in the third data register D1 from the count value (D0 [15:0]) stored in the first data register D0.

<Illuminance Measurement>

Figure 16:
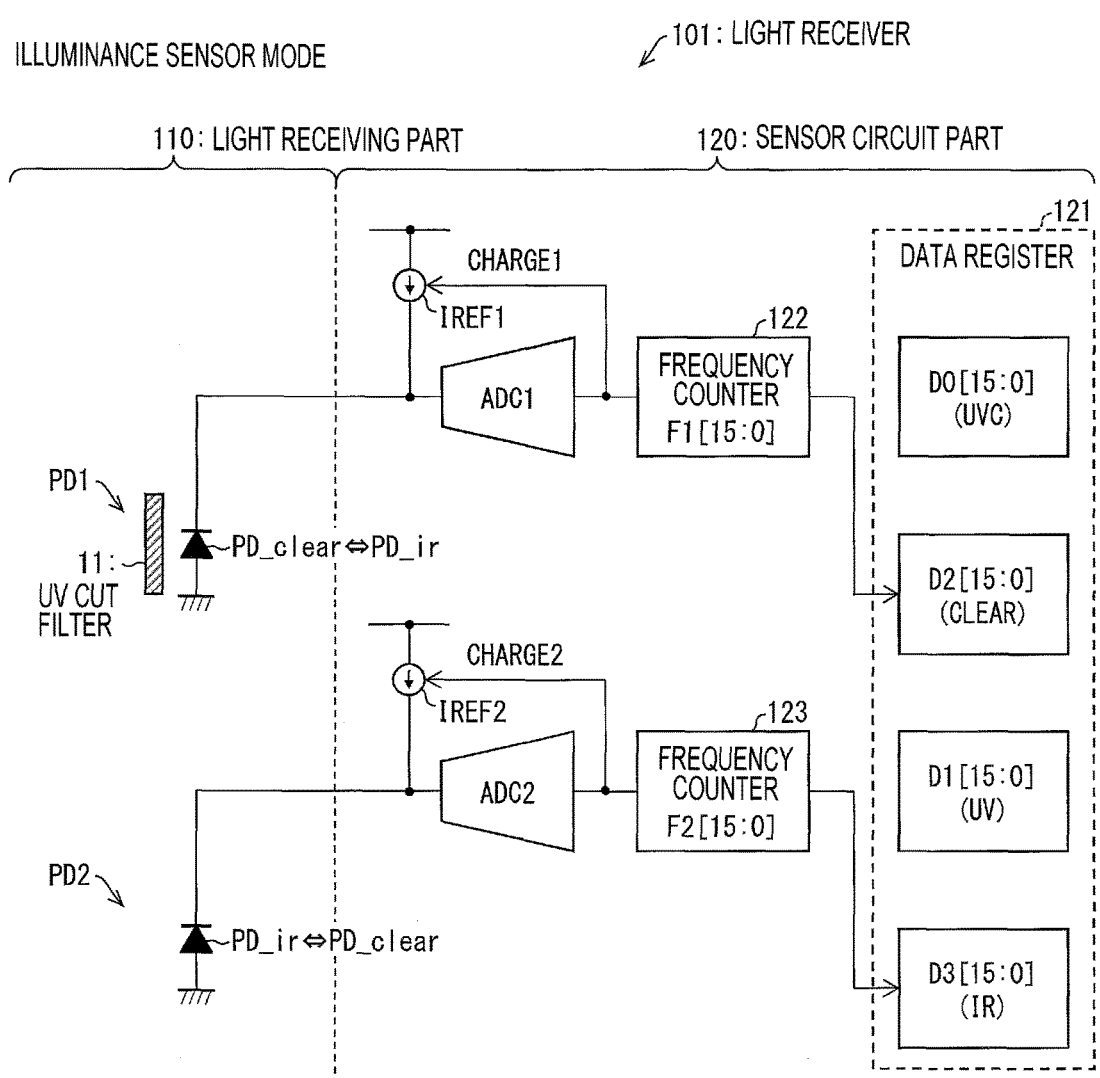
FIG. 16 is a block diagram illustrating the configuration of the light receiver according to the second embodiment, when measuring the illuminance.

FIG. 16 is a block diagram illustrating the configuration of the light receiver according to the present embodiment, when measuring the illuminance.

Figure 17:
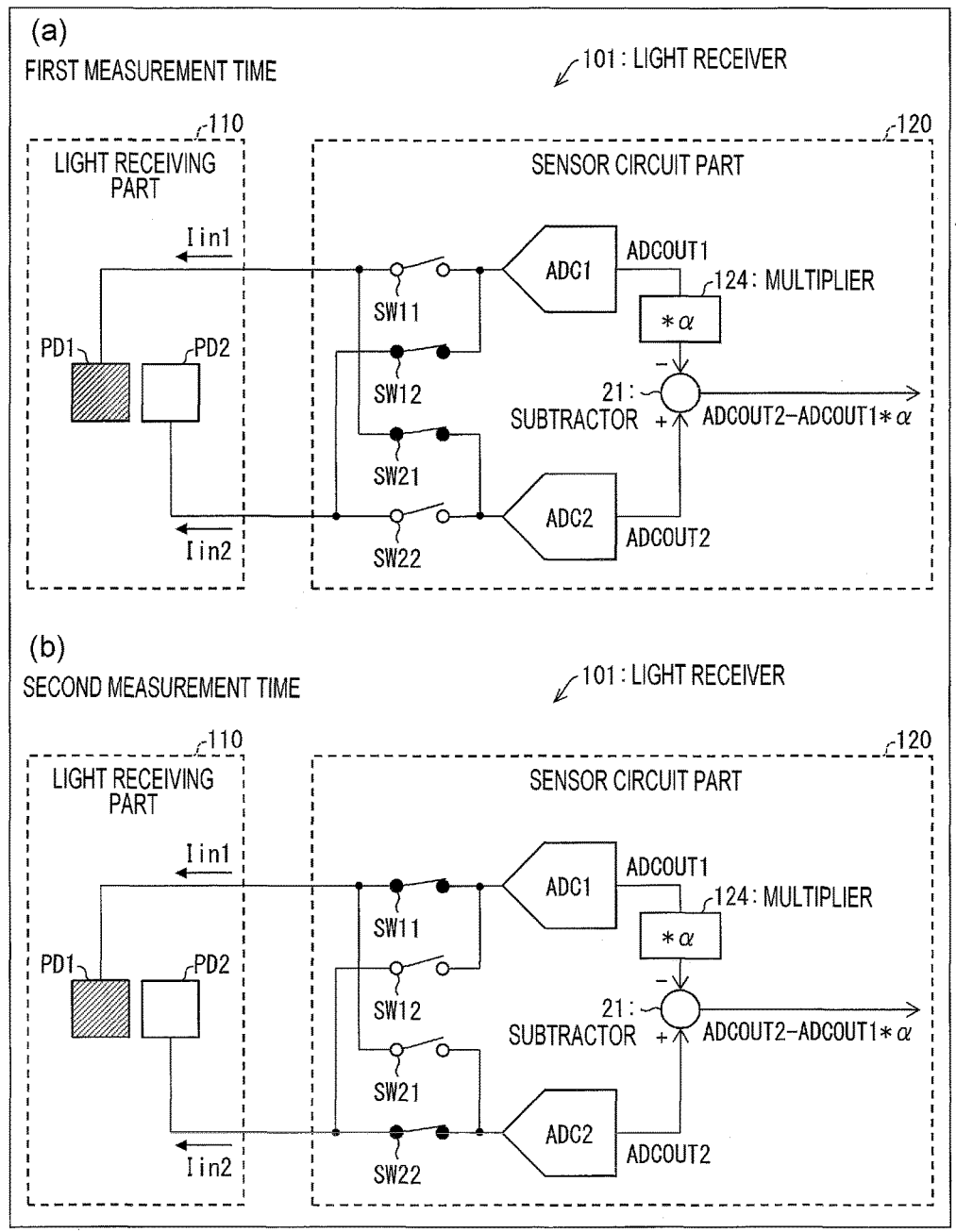
FIG. 17 is a block diagram illustrating the configuration of the light receiver according to the second embodiment, when measuring the illuminance, which includes part (a) illustrating a first open/closed state of the switches, and part (b) illustrating a second open/closed state of the switches.

FIG. 17 is a block diagram illustrating the configuration of the light receiver according to the present embodiment, when measuring the illuminance, which includes part (a) illustrating a first open/closed state of the switches, and part (b) illustrating a second open/closed state of the switches.

As illustrated in FIG. 17, a sensor circuit part 120 of a light receiver 101 of the present embodiment has four switches (SW11, SW12, SW21, and SW22). Accordingly, the connections of the first light receiving element PD1 and second light receiving element PD2 with the A/D converter ADC1 and A/D converter ADC2 can be switched.

In addition, the sensor circuit part 120 has a multiplier 124 that multiples the digital output value ADCOUNT1 of the A/D converter ADC1 by α (α is a constant value). α is a coefficient appropriately set to bring the spectral sensitivity characteristic of the illuminance calculated by the subtractor 21 close to the spectral sensitivity characteristic of the luminosity.

To measure the illuminance, the first light receiving element PD1 and the second light receiving element PD2 alternately enter the state in which the switches SW1, SW2, and SW4 are turned on and the switches SW3 and SW5 are turned off, as illustrated in FIG. 13, and the state in which the switches SW1, SW2, and SW5 are turned on and the switches SW3 and SW4 are turned off, as illustrated in FIG. 14.

Specifically, a measurement time for measuring the illuminance is divided into a first measurement time (first period) and a second measurement time (second period), as illustrated in FIG. 5.

For example, in the first measurement time, the first light receiving element PD1 enters the open/closed state of the switches illustrated in FIG. 13, thereby extracting the photocurrents from all the photodiodes PD_clear of the first light receiving element PD1, which are then input to the A/D converter ADC2. Furthermore, the second light receiving element PD2 enters the open/closed state of the switches illustrated in FIG. 14, thereby extracting the photocurrent from the photodiode PD_ir of the second light receiving element PD2, which is then input to the A/D converter ADC1.

In the second measurement time, the first light receiving element PD1 enters the open/closed state of the switches illustrated in FIG. 14, thereby extracting the photocurrent from the photodiode PD_ir of the first light receiving element PD1, which is then input to the A/D converter ADC1. Furthermore, the second light receiving element PD2 enters the open/closed state of the switches illustrated in FIG. 13, thereby extracting the photocurrents from all the photodiodes PD_clear of the second light receiving element PD2, which are then input to the A/D converter ADC2.

The illuminance calculated by the subtractor 21 in the first measurement time and the illuminance calculated by the subtractor 21 in the second measurement time are averaged. Accordingly, even when the first light receiving element PD1 and the second light receiving element PD2 are irradiated with light with deviation, the illuminance can be measured without causing deviation of the light entering amount, sensitivity variation, and errors. Although the first light receiving element PD1 is covered with the UV cut filter 11, the influence of the UV cut filter 11 during the illuminance measurement can be averaged and dispersed. As a result, the influence of the UV cut filter 11 can be reduced.

Third Embodiment

Another embodiment of the present invention will be described as follows on the basis of FIGS. 18 to 21. For the sake of description, members that have the same functions as those described in the above-described embodiment are given the same symbols, and descriptions thereof are omitted.

<Light Receiving Part>

Figure 18:
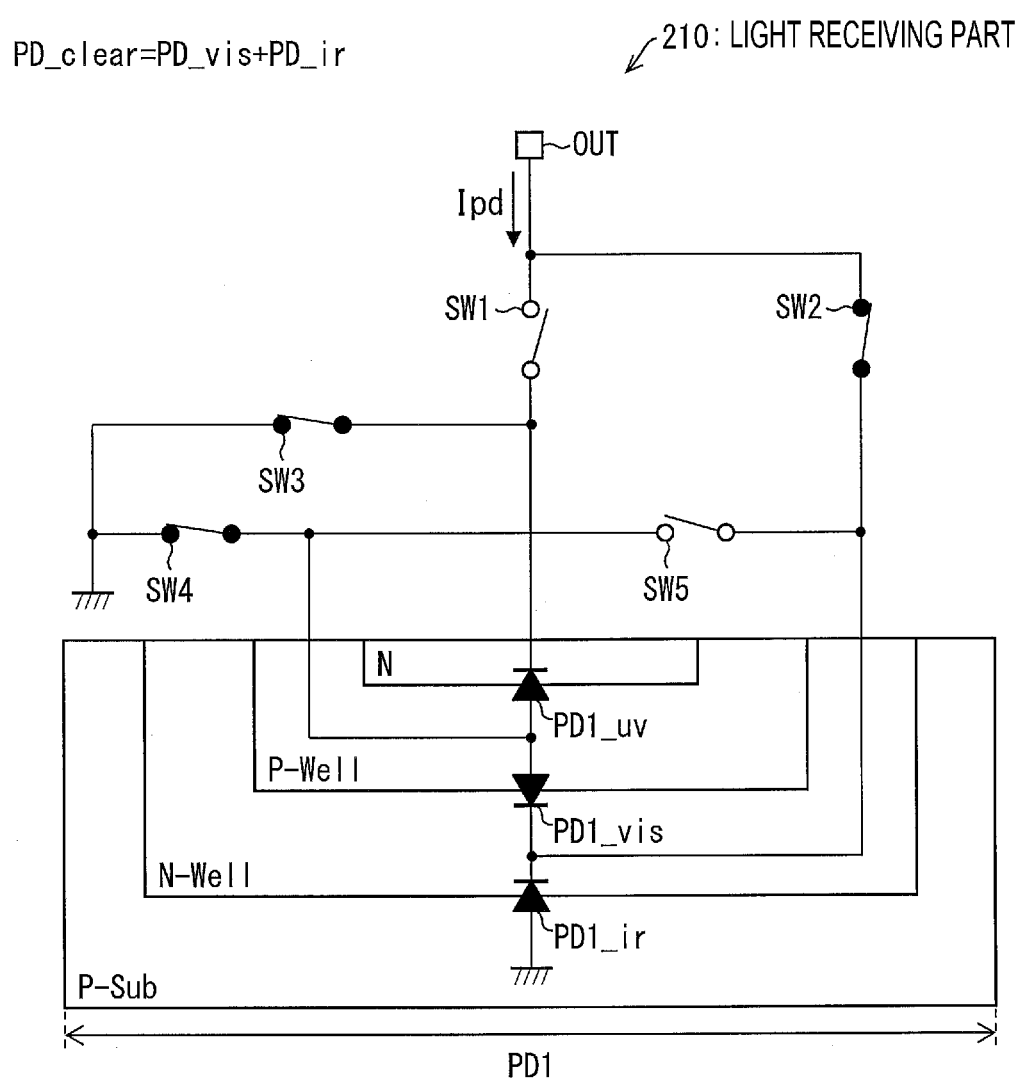
FIG. 18 is a cross sectional view of a first light receiving element of a light receiver according to a third embodiment of the present invention.

FIG. 18 is a cross sectional view of the first light receiving element of the light receiver according to the present embodiment. A light receiving part 210 includes the first light receiving element PD1 and second light receiving element. Since the configuration of the second light receiving element is the same as that of the first light receiving element PD1, a description thereof is omitted. Like the light receiving part of the first embodiment, although a UV cut filter is provided above the first light receiving element PD, an illustration and detailed description thereof are omitted.

As illustrated in FIG. 18, the first light receiving element PD1 of the light receiving part 210 includes five switches SW1 to 5, like the first light receiving element PD1 of the light receiving part 110 of the second embodiment.

<Illuminance Measurement>

In the first light receiving element PD1 of the light receiving part 210, as illustrated in FIG. 18, the first light receiving element PD1 enters a state (third state) in which the first light receiving element PD1 has a sensitivity to light in the visible light range and the infrared range by turning off the switch SW1 and the switch SW5, turning on the switch SW2, the switch SW3, and the switch SW4, and short-circuiting the photodiode PD_uv. Accordingly, only the photodiode PD_ir and the photodiode PD_vis are used.

That is, the photodiodes PD_clear in the first light receiving element PD1 and the second light receiving element PD2 of the present embodiment are the photodiode PD_ir and the photodiode PD_vis.

Figure 19:
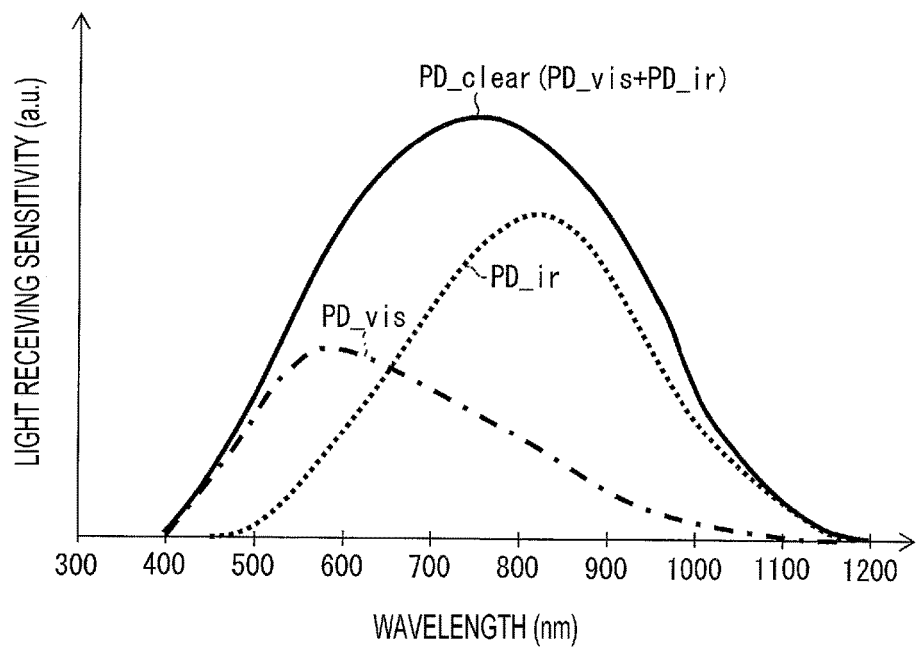
FIG. 19 is a diagram illustrating the spectral sensitivity characteristics of individual photodiodes of the first light receiving element.

FIG. 19 is a diagram illustrating the spectral sensitivity characteristics of the individual photodiodes of the first light receiving element.

The photodiode PD_uv is short-circuited in the first light receiving element PD1 and the second light receiving element PD2 of the present embodiment. Accordingly, in the spectral sensitivity characteristics of the first light receiving element PD1 and the second light receiving element PD2, illuminance measurement closer to luminosity can be performed, while suppressing a sensitivity to wavelength 400 nm or less.

<Others>

Furthermore, a UV/IR cut filter (second optical filter) that cuts off light in the ultraviolet range and the infrared range may be provided above the first light receiving element PD1 and the second light receiving element PD2.

Figure 20:
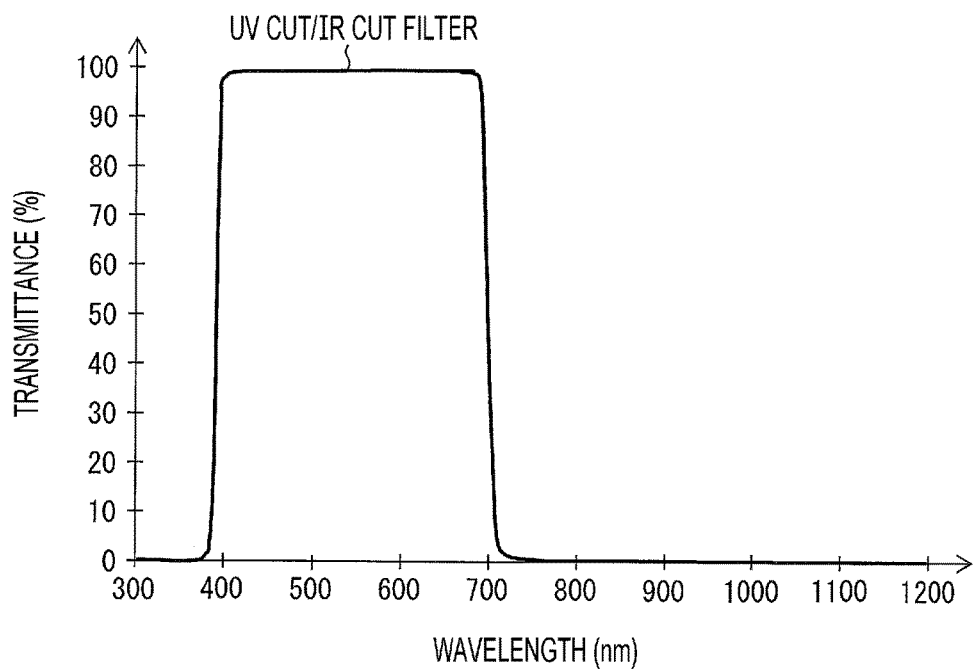
FIG. 20 is a diagram illustrating the spectral transmittance characteristic of an UV/IR cut filter.

FIG. 20 is a diagram illustrating the spectral transmittance characteristic of the UV/IR cut filter.

Figure 21:
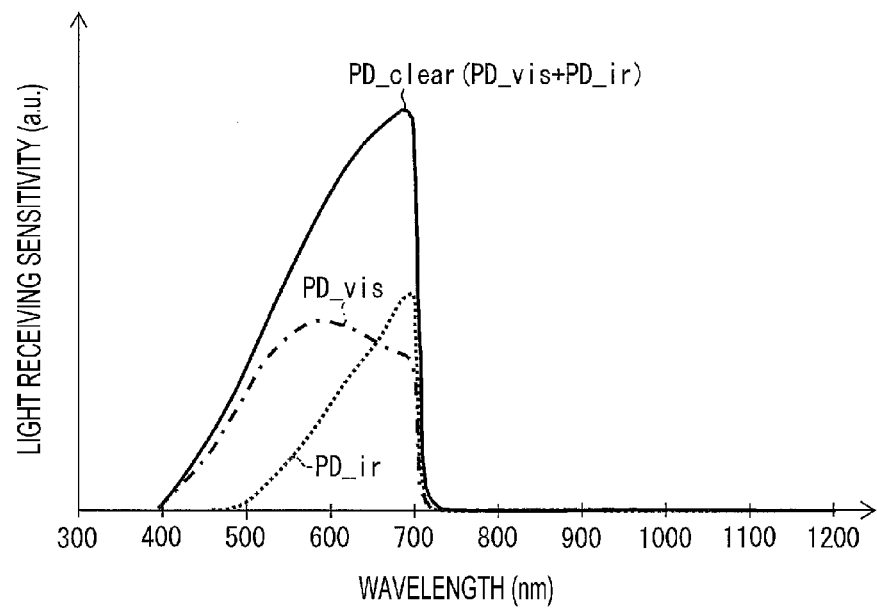
FIG. 21 is a diagram illustrating the spectral sensitivity characteristics of a light receiving element when the UV/IR cut filter is provided.

FIG. 21 is a diagram illustrating the spectral sensitivity characteristics of the light receiving element when the UV/IR cut filter is provided.

By providing the UV/IR cut filter which cuts off light whose wavelength is 400 nm or less and light whose wavelength is 700 nm or more above the first light receiving element PD1 and the second light receiving element PD2, the spectral sensitivity characteristics of the first light receiving element PD1 and the second light receiving element PD2 become the spectral sensitivity characteristics illustrated in FIG. 21.

Accordingly, only a photocurrent generated by receiving light whose wavelength is in the visible light range (400 nm to 700 nm) can be extracted from the first light receiving element PD1 and the second light receiving element PD2. As a result, highly-accurate illuminance measurement close to luminosity (luminosity wavelength range: 400 nm to 700 nm) can be performed.

Fourth Embodiment

Another embodiment of the present invention will be described as follows on the basis of FIGS. 22 and 23. For the sake of description, members that have the same functions as those described in the above-described embodiment are given the same symbols, and descriptions thereof are omitted.

<Light Receiving Part>

Figure 22:
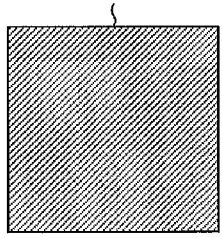
FIG. 22 is a plan view of a light receiving part of a light receiver according to a fourth embodiment of the present invention.
Figure 22:
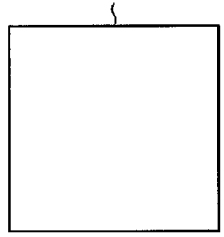
Figure 22:
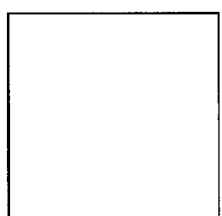
Figure 22:
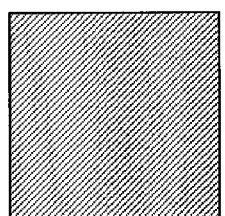

FIG. 22 is a plan view of a light receiving part of a light receiver according to the present embodiment. As illustrated in FIG. 22, a light receiving part 310 includes first to fourth light receiving elements PD1 to PD4. The first to fourth light receiving elements PD1 to PD4 are arranged in such a manner that one square is divided into four square portions.

In other words, the first to fourth light receiving elements PD1 to PD4 are arranged in two rows and two columns. In the vertical direction, the first light receiving element PD1 and the third light receiving element PD3 are adjacent to each other, and the second light receiving element PD2 and the fourth light receiving element PD4 are adjacent to each other. In the horizontal direction, the first light receiving element PD1 and the second light receiving element PD2 are adjacent to each other, and the third light receiving element PD3 and the fourth light receiving element PD4 are adjacent to each other.

A UV cut filter (not illustrated) is provided above the first light receiving element PD1 and the fourth light receiving element PD4.

<Illuminance Measurement>

Figure 23:
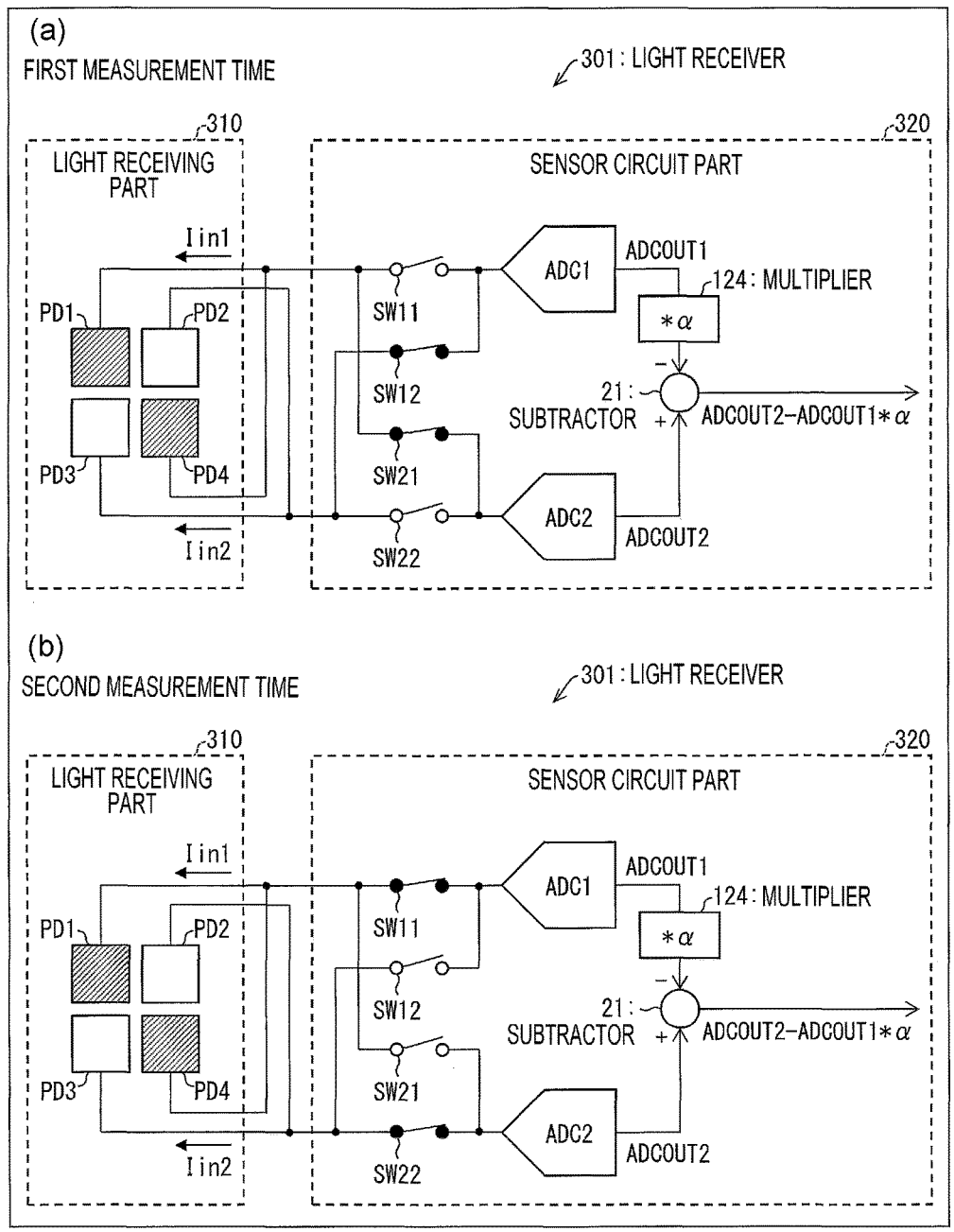
FIG. 23 is a block diagram illustrating the configuration of the light receiver according to the fourth embodiment, when measuring the illuminance, which includes part (a) illustrating a first open/closed state of switches, and part (b) illustrating a second open/closed state of the switches.
Figure 24:
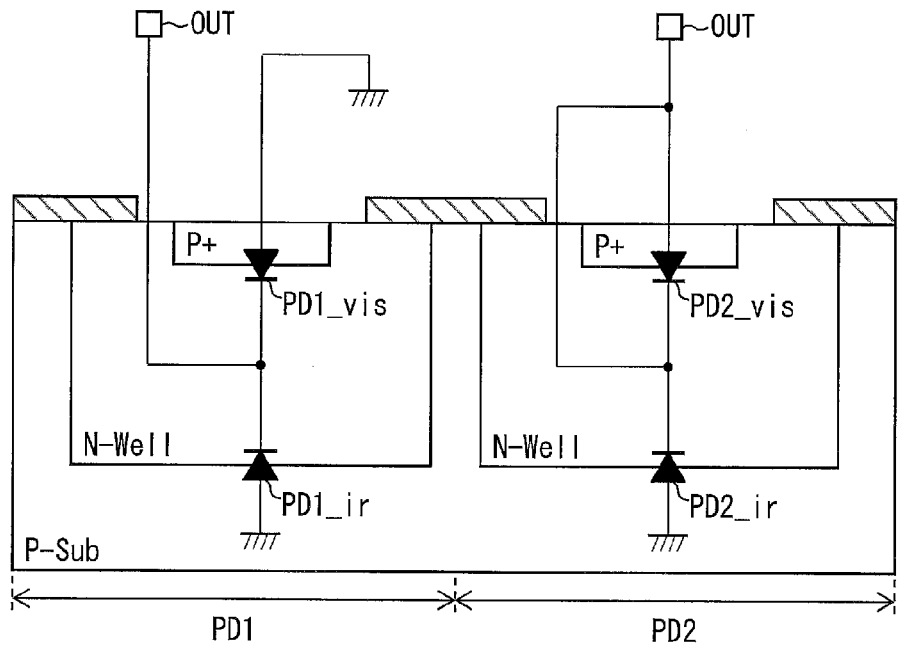
FIG. 24 is a cross sectional view of an optical sensor of the related art.
Figure 25:
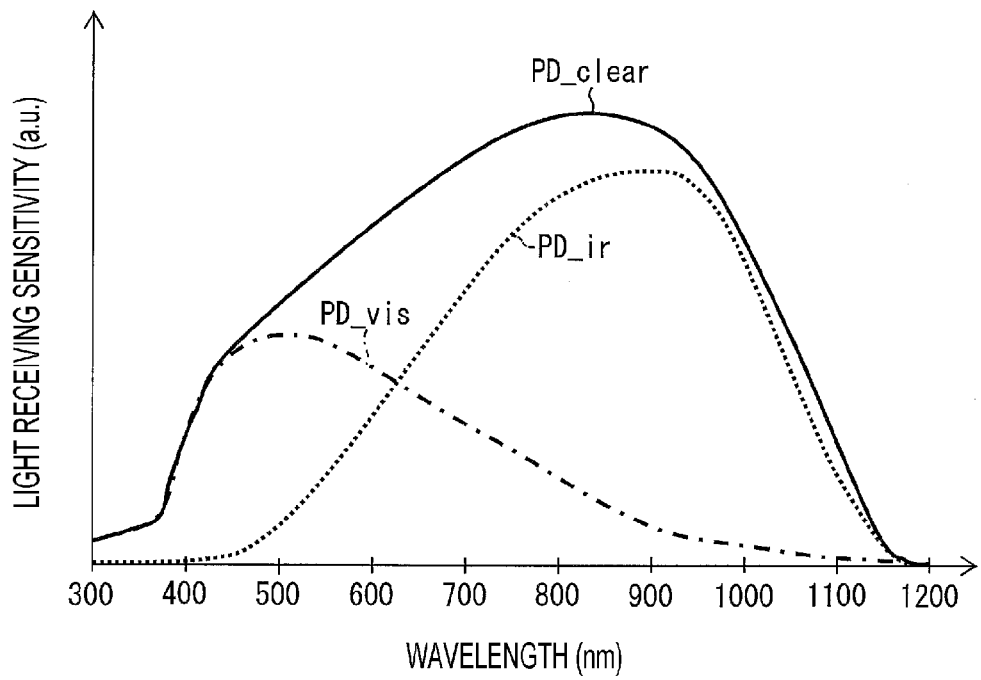
FIG. 25 is a diagram illustrating the spectral sensitivity characteristics of the optical sensor of the related art.

FIG. 23 is a block diagram illustrating the configuration of the light receiver according to the present embodiment, when measuring the illuminance, which includes part (a) illustrating a first open/closed state of the switches, and part (b) illustrating a second open/closed state of the switches.

As illustrated in FIG. 23, a sensor circuit part 320 of a light receiver 301 of the present embodiment has four switches (SW11, SW12, SW21, and SW22). Accordingly, the connections of the first to fourth light receiving elements PD1 to 4 with the A/D converter ADC1 and A/D converter ADC2 can be switched.

To measure the illuminance, in the first measurement time, the first light receiving element PD1 and the fourth light receiving element PD4 enter the open/closed state of the switches illustrated in FIG. 18, thereby extracting the photocurrents from all the photodiodes PD_clear of the first light receiving element PD1 and the fourth light receiving element PD4, which are then input to the A/D converter ADC2. Furthermore, the second light receiving element PD2 and the third light receiving element PD3 enter the open/closed state of the switches illustrated in FIG. 14, thereby extracting the photocurrents from the photodiodes PD_ir of the second light receiving element PD2 and the third light receiving element PD3, which are then input to the A/D converter ADC1.

In the second measurement time, the first light receiving element PD1 and the fourth light receiving element PD4 enter the open/closed state of the switches illustrated in FIG. 14, thereby extracting the photocurrents from the photodiode PD_ir of the first light receiving element PD1 and the fourth light receiving element PD4, which are then input to the A/D converter ADC1. Furthermore, the second light receiving element PD2 and the third light receiving element PD3 enter the open/closed state of the switches illustrated in FIG. 18, thereby extracting the photocurrents from all the photodiodes PD_clear of the second light receiving element PD2 and the third light receiving element PD3, which are then input to the A/D converter ADC2.

Accordingly, even when the first to fourth light receiving elements PD1 to 4 are irradiated with light with deviation, the illuminance can be measured without causing deviation of the light entering amount, sensitivity variation, and errors by averaging the illuminance calculated by the subtractor 21 in the first measurement time and the illuminance calculated by the subtractor 21 in the second measurement time.

Although the first light receiving element PD1 and the fourth light receiving element PD4 are covered with the UV cut filter, the influence of the UV cut filter during the illuminance measurement can be averaged and dispersed. As a result, the influence of the UV cut filter can be reduced.

Since the first to fourth light receiving elements PD1 to PD4 are arranged in two rows and two columns in the light receiving part 310 of the present embodiment, deviation of the incident light and sensitivity variation can be reduced, and, as a result, illuminance measurement with higher accuracy can be performed.

Fifth Embodiment

Another embodiment of the present invention will be described as follows on the basis of FIGS. 26 to 30. For the sake of description, members that have the same functions as those described in the above-described embodiment are given the same symbols, and descriptions thereof are omitted.

<Light Receiving Part>

Figure 26:
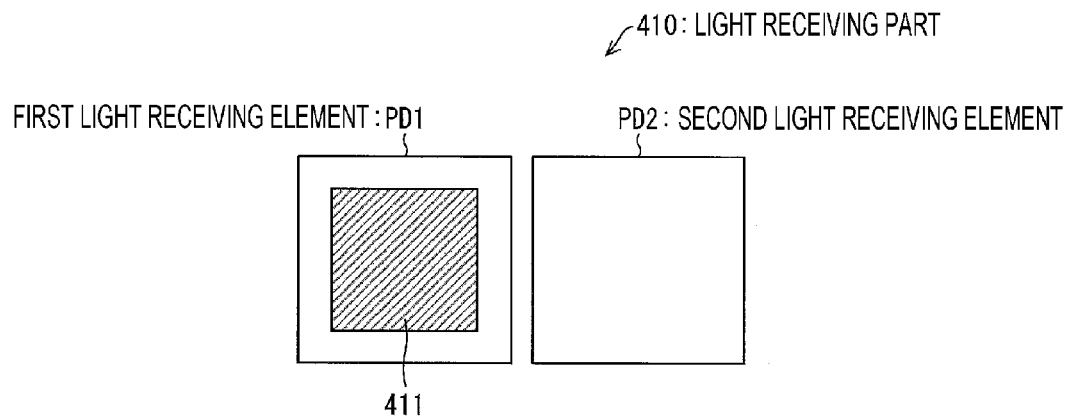
FIG. 26 is a plan view of a light receiving part of a light receiver according to a fifth embodiment.

FIG. 26 is a plan view of a light receiving part of a light receiver according to the present embodiment. As illustrated in FIG. 26, a light receiving part 410 includes the first light receiving element PD1 and the second light receiving element PD2 arranged adjacent to each other when viewed in plan. A UV cut filter 411 is provided above part of the first light receiving element PD1.

Figure 27:
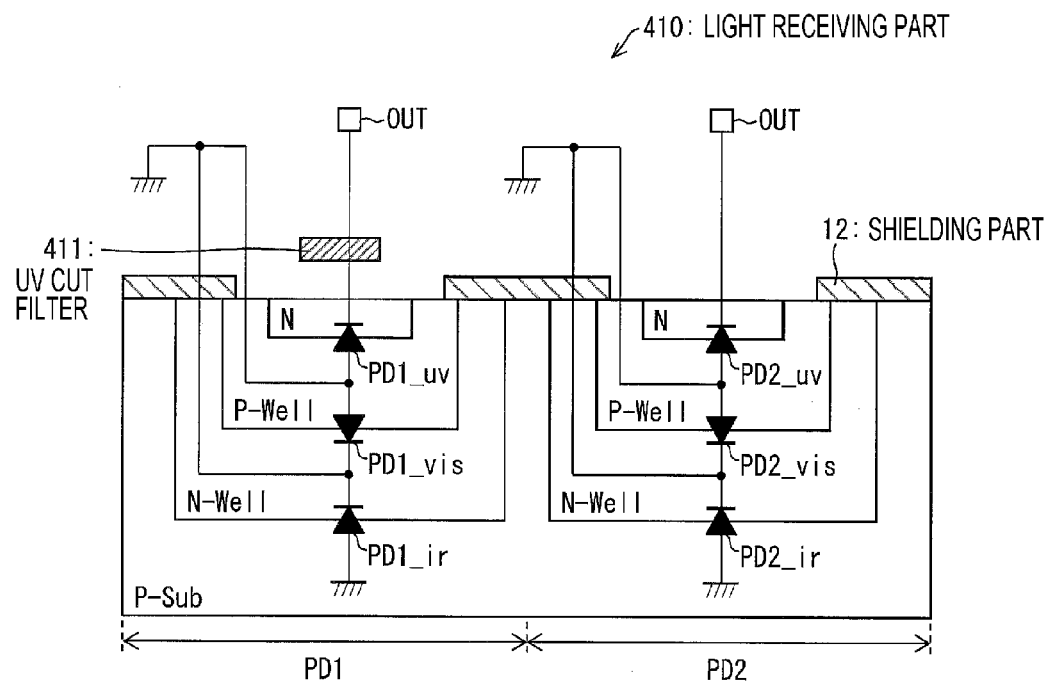
FIG. 27 is a cross sectional view of the light receiving part of the light receiver according to the fifth embodiment of the present invention.

FIG. 27 is a cross sectional view of the light receiving part of the light receiver according to the present embodiment. As illustrated in FIG. 27, the light receiving part 410 includes the first light receiving element PD1, the second light receiving element PD2, and the UV cut filter 411 provided above part of the first light receiving element PD1. Accordingly, light that has passed through the UV cut filter 411 enters an area of the first light receiving element PD1 where the UV cut filter 411 is present, and incident light directly enters an area of the first light receiving element PD1 where there is no UV cut filter 411.

The UV cut filter 411 is the same as the UV cut filter 11 of the first embodiment in the points including the transmittance of light in the ultraviolet wavelength range, transmittance of light in ranges other than the ultraviolet wavelength range, and materials, but is different from the UV cut filter 11 in the arrangement above the first light receiving element PD.

Specifically, the UV cut filter 411 is provided above the first light receiving element PD1 so as to cover part of the n-type diffusion layer N. Light that has passed through the UV cut filter 411 enters an area where the UV cut filter 411 is present above the n-type diffusion layer N, and incident light directly enters an area where there is no UV cut filter 411 above the n-type diffusion layer N.

Figure 28:
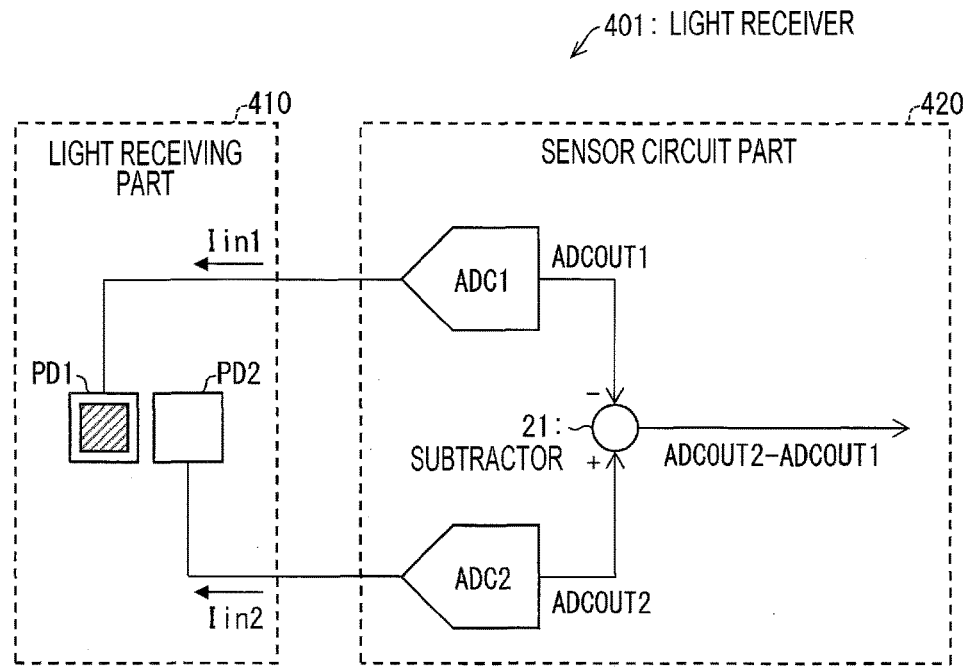
FIG. 28 is a block diagram illustrating the configuration of the light receiver according to the fifth embodiment.

FIG. 28 is a block diagram illustrating the configuration of the light receiver according to the present embodiment. As illustrated in FIG. 28, a light receiver 401 includes the light receiving part 410 which allows a photocurrent to flow in response to reception of light, and a sensor circuit part 420 that detects the intensity of the light on the basis of the photocurrent. The sensor circuit part 420 includes the A/D converter ADC1, the A/D converter ADC2, and the subtractor 21 (arithmetic operation unit).

<Ultraviolet Intensity Measurement>

Next, the principle of detecting the ultraviolet intensity using the light receiver 401 will be described.

Figure 29:
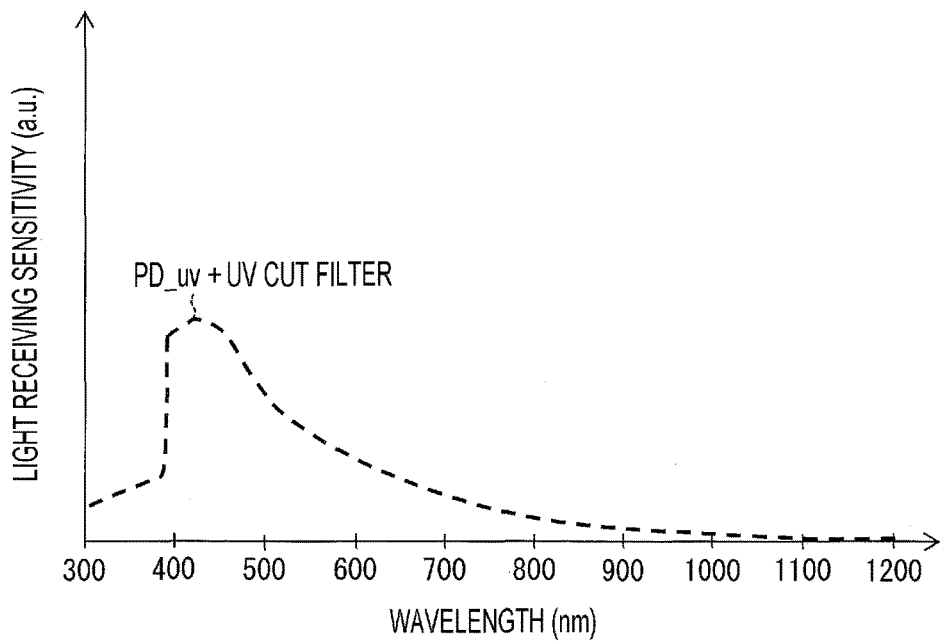
FIG. 29 is a diagram illustrating the spectral sensitivity characteristic of the photodiode PD_uv relative to light passing through and light not passing through the UV cut filter according to the fifth embodiment.

FIG. 29 is a diagram illustrating the spectral sensitivity characteristic of the photodiode PD_uv relative to light passing through and light not passing through the UV cut filter according to the present embodiment.

In the light receiving part 410 of the light receiver 401, the UV cut filter 411 is provided above the first light receiving element PD1 so as to cover part of the n-type diffusion layer N. Therefore, light that has passed through the UV cut filter 411 enters an area where the UV cut filter 411 is present above the n-type diffusion layer N, and incident light directly enters an area where there is no UV cut filter 411 above the n-type diffusion layer N.

Therefore, the spectral sensitivity characteristic of the first light receiving element PD1 becomes the spectral sensitivity characteristic illustrated in FIG. 29. In contrast, the UV cut filter 411 is not provided above the second light receiving element PD2, and accordingly the spectral sensitivity characteristic of the second light receiving element PD2 becomes the spectral sensitivity characteristic illustrated in FIG. 6.

In the sensor circuit part 420 of the light receiver 401, the subtractor 21 calculates the difference between the digital output value ADCOUNT2 and the digital output value ADCOUNT1.

The difference obtained by the calculation performed by the subtractor 21 is equal to the result of subtracting the intensity of light entering the first light receiving element PD1 from the intensity of light entering the second light receiving element PD2. Therefore, the spectral sensitivity characteristic of the entire light receiving part 410 can be regarded as the spectral sensitivity characteristic illustrated in FIG. 30.

As has been described above, in the first light receiving element PD1, light that has passed through the UV cut filter 411 enters an area where the UV cut filter 411 is present above the n-type diffusion layer N, and incident light directly enters an area where there is no UV cut filter 411 above the n-type diffusion layer N.

Therefore, comparison between FIG. 29 of the present embodiment and FIG. 8 of the first embodiment indicates that the spectral sensitivity characteristic of the photodiode PD_uv is different in the ultraviolet range where the wavelength is 400 nm or less. Specifically, the photodiode PD_uv of the first light receiving element PD1 of the first embodiment has a significantly small light receiving sensitivity in the range where the wavelength is 380 nm or less, whereas the photodiode PD_uv of the first light receiving element PD1 of the present embodiment has a certain degree of light receiving sensitivity in the range where the wavelength is 380 nm or less.

Figure 9:
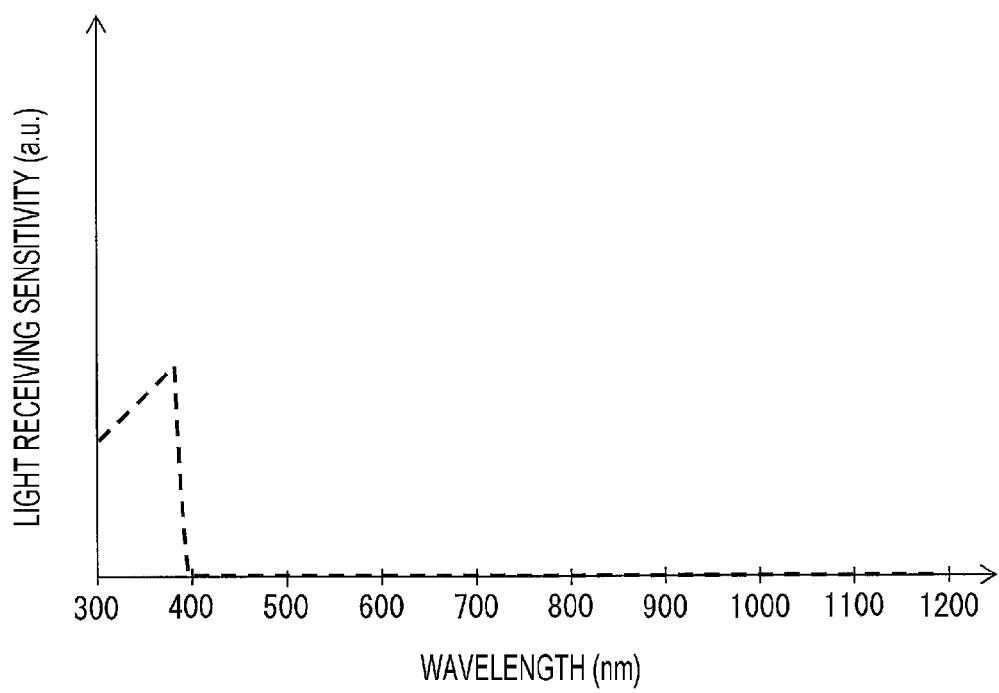
FIG. 9 is a diagram illustrating the spectral sensitivity characteristic of the entire light receiving part of the light receiver according to the first embodiment.
Figure 30:
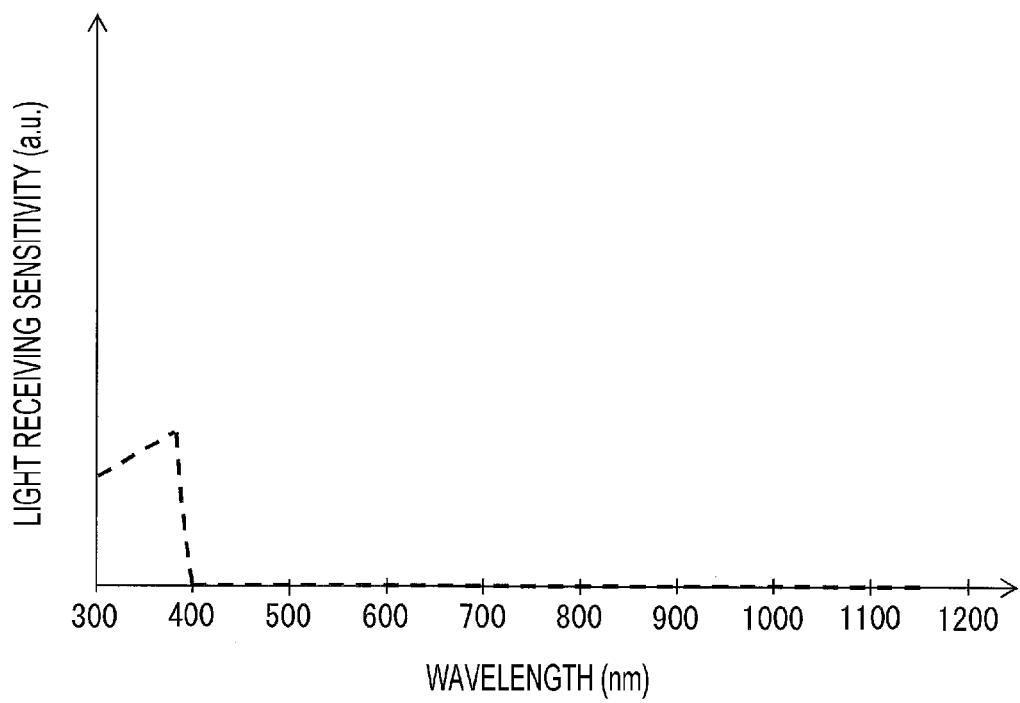
FIG. 30 is a diagram illustrating the spectral sensitivity characteristic of the entire light receiving part of the light receiver according to the fifth embodiment.

Accordingly, as illustrated in FIG. 9 and FIG. 30, the light receiver 401 has a smaller difference (calculated value) obtained by calculation performed by the subtractor 21, compared with the light receiver 1 of the first embodiment; however, the light receiver 401 can accurately measure the ultraviolet intensity, like the light receiver 1.

According to the light receiver 401 of the present embodiment, the UV cut filter 411 need not cover the entire top surface of the first light receiving element PD1. Therefore, the degree of freedom in designing the light receiver 401 can be increased.

CONCLUSION

A light receiver (1) according to a first aspect of the present invention includes a light receiving element that allows a photocurrent to flow in response to reception of light, and a detector (sensor circuit part 20) that detects intensity of the light on the basis of the photocurrent. The light receiver includes, as the light receiving element, a first light receiving element (PD1) and a second light receiving element (PD2) that are arranged adjacent to each other, and that have an identical spectral sensitivity characteristic; and an optical filter whose transmittance of light in a certain wavelength range is lower than transmittance of light in ranges other than the certain wavelength range. Light that has passed through the optical filter enters the first light receiving element, and the detector includes an arithmetic operation unit (subtractor) that calculates a difference between a photocurrent of the first light receiving element and a photocurrent of the second light receiving element.

According to the above-described configuration, since the first light receiving element and the second light receiving element are light receiving elements that have the identical spectral sensitivity characteristic, they can be light receiving elements with the same multilayer structure. Accordingly, the manufacturing steps become simpler and the manufacturing cost can be reduced.

According to the above-described configuration, mainly light excluding light in the above-described certain wavelength range enters the first light receiving element, and the first light receiving element allows a photocurrent in accordance with the intensity of the light to flow. In contrast, light including light in the above-described certain wavelength range enters the second light receiving element, and the second light receiving element allows a photocurrent in accordance with the intensity of the light to flow. By calculating the difference between the photocurrent of the first light receiving element and the photocurrent of the second light receiving element with the use of the arithmetic operation unit, the intensity of light in the above-described certain wavelength range can be measured.

In the light receiver according to a second aspect of the present invention, in the first aspect, the first light receiving element and the second light receiving element at least have a sensitivity to light in a ultraviolet wavelength range. The optical filter (UV cut filter 11) may have transmittance of light in the ultraviolet wavelength range that is lower than transmittance of light in ranges other than the ultraviolet wavelength range.

According to the above-described configuration, mainly light excluding light in the ultraviolet wavelength range enters the first light receiving element, and the first light receiving element mainly allows a photocurrent in accordance with the intensity of the light excluding the ultraviolet wavelength range to flow. In contrast, light including light in the ultraviolet wavelength range enters the second light receiving element, and the second light receiving element allows a photocurrent in accordance with the intensity of the light including the light in the ultraviolet wavelength range to flow. By calculating the difference between the photocurrent of the first light receiving element and the photocurrent of the second light receiving element with the use of the arithmetic operation unit, the intensity of light in the ultraviolet wavelength range can be measured.

In the light receiver according to a third aspect of the present invention, in the second aspect, the first light receiving element and the second light receiving element are capable of switching between a first state with a sensitivity to light in the ultraviolet range, a visible light range, and an infrared range and a second state with a sensitivity to light in the infrared range. The first light receiving element is in the first state and the second light receiving element is in the second state in a first period (first measurement period). The first light receiving element is in the second state and the second light receiving element is in the first state in a second period (second measurement period) different from the first period. The detector may calculate an average of the difference between the photocurrent of the first light receiving element and the photocurrent of the second light receiving element in the first period and the difference between the photocurrent of the first light receiving element and the photocurrent of the second light receiving element in the second period.

By calculating the difference between the photocurrent of the first light receiving element and the photocurrent of the second light receiving element in the first period, the illuminance can be measured.

According to the above-described configuration, light in the ultraviolet range, the visible light range, and the infrared range is received by the first light receiving element in the first period and by the second light receiving element in the second period. In addition, light in the infrared range is received by the second light receiving element in the first period and by the first light receiving element in the second period.

That is, this is equal to performing detection while replacing the arrangement of the light receiving element which has a sensitivity to light in the ultraviolet range, the visible light range, and the infrared range and the light receiving element which has a sensitivity to light in the infrared range between the first period and the second period.

Therefore, even when the first light receiving element and the second light receiving element are irradiated with light with deviation, the illuminance can be measured without causing deviation or sensitivity variation. Although the first light receiving element is covered with the optical filter which cuts off light in the ultraviolet wavelength range, the influence of the optical filter on the illuminance detection can be reduced.

In the light receiver according to a fourth aspect of the present invention, in the second aspect, the first light receiving element and the second light receiving element are capable of switching between a third state with a sensitivity to light in a visible light range and an infrared range and a second state with a sensitivity to light in the infrared range. The first light receiving element is in the third state and the second light receiving element is in the second state in a first period. The first light receiving element is in the second state and the second light receiving element is in the third state in a second period different from the first period. The detector may calculate an average of the difference between the photocurrent of the first light receiving element and the photocurrent of the second light receiving element in the first period and the difference between the photocurrent of the first light receiving element and the photocurrent of the second light receiving element in the second period.

According to the above-described configuration, light in the visible light range and the infrared range is received by the first light receiving element in the first period and by the second light receiving element in the second period. In addition, light in the infrared range is received by the second light receiving element in the first period and by the first light receiving element in the second period.

That is, this is equal to performing detection while replacing the arrangement of the light receiving element which has a sensitivity to light in the visible light range and the infrared range and the light receiving element which has a sensitivity to light in the infrared range between the first period and the second period.

Therefore, even when the first light receiving element and the second light receiving element are irradiated with light with deviation, the illuminance can be measured without causing deviation or sensitivity variation.

Since the first light receiving element is covered with the ultraviolet ray cut filter, the influence of the ultraviolet ray cut filter during the illuminance measurement can be reduced according to the above-described configuration.

The light receiver according to a fifth aspect of the present invention, in the third or fourth aspect, further includes a second optical filter (UV/IR cut filter). Light that has passed through the second optical filter enters the first light receiving element and the second light receiving element. The second optical filter may have transmittance of light in the infrared wavelength range that is lower than transmittance of light in ranges other than the infrared wavelength range.

A mobile electronic device according to a sixth aspect of the present invention includes the light receiver according to any one of the first to fifth aspects.

The present invention is not limited to the above-described embodiments, and various changes can be made within the scope of the claims. An embodiment obtained by appropriately combining technical means disclosed in different embodiments is also included in the technical scope of the present invention. Also, a new technical feature may be obtained by combining technical means disclosed in the embodiments.

INDUSTRIAL APPLICABILITY

The present invention can be preferably used as a light receiver mounted on a mobile electronic device such as a smart phone.

REFERENCE SIGNS LIST 1, 101, 301, 401 light receiver
10, 110, 210, 310, 410 light receiving part
11, 411 UV cut filter (optical filter)
20, 120, 320, 420 sensor circuit part (detector)
21 subtractor (arithmetic operation unit)
Iin, Iin1, Iin2 photocurrent
PD1 first light receiving element
PD2 second light receiving element

The invention claimed is:

1. A light receiver including a light receiving element that allows a photocurrent to flow in response to reception of light, and a detector that detects intensity of the light on the basis of the photocurrent, comprising:
   as the light receiving element, a first light receiving element and a second light receiving element that are arranged adjacent to each other, and that have an identical spectral sensitivity characteristic; and
   an optical filter whose transmittance of light in a certain wavelength range is lower than transmittance of light in ranges other than the certain wavelength range,
   wherein light that has passed through the optical filter enters the first light receiving element,
   wherein the detector includes an arithmetic operation unit that calculates a difference between a photocurrent of the first light receiving element and a photocurrent of the second light receiving element,
   the first light receiving element and the second light receiving element have a sensitivity to light at least in a ultraviolet wavelength range,
   the optical filter has transmittance of light in the ultraviolet wavelength range that is lower than transmittance of light in ranges other than the ultraviolet wavelength range,
   the first light receiving element and the second light receiving element are capable of switching between a first state with a sensitivity to light in the ultraviolet range, a visible light range, and an infrared range and a second state with a sensitivity to light in the infrared range,
   the first light receiving element is in the first state and the second light receiving element is in the second state in a first period,
   the first light receiving element is in the second state and the second light receiving element is in the first state in a second period different from the first period, and
   the detector calculates an average of the difference between the photocurrent of the first light receiving element and the photocurrent of the second light receiving element in the first period and the difference between the photocurrent of the first light receiving element and the photocurrent of the second light receiving element in the second period.

2. A mobile electronic device comprising the light receiver according to claim 1.

3. A light receiver including a light receiving element that allows a photocurrent to flow in response to reception of light, and a detector that detects intensity of the light on the basis of the photocurrent, comprising:
   as the light receiving element, a first light receiving element and a second light receiving element that are arranged adjacent to each other, and that have an identical spectral sensitivity characteristic; and
   an optical filter whose transmittance of light in a certain wavelength range is lower than transmittance of light in ranges other than the certain wavelength range,
   wherein light that has passed through the optical filter enters the first light receiving element,
   wherein the detector includes an arithmetic operation unit that calculates a difference between a photocurrent of the first light receiving element and a photocurrent of the second light receiving element,
   the first light receiving element and the second light receiving element have a sensitivity to light at least in a ultraviolet wavelength range,
   the optical filter has transmittance of light in the ultraviolet wavelength range that is lower than transmittance of light in ranges other than the ultraviolet wavelength range,
   the first light receiving element and the second light receiving element are capable of switching between a third state with a sensitivity to light in a visible light range and an infrared range and a second state with a sensitivity to light in the infrared range,
   the first light receiving element is in the third state and the second light receiving element is in the second state in a first period,
   the first light receiving element is in the second state and the second light receiving element is in the third state in a second period different from the first period, and
   the detector calculates an average of the difference between the photocurrent of the first light receiving element and the photocurrent of the second light receiving element in the first period and the difference between the photocurrent of the first light receiving element and the photocurrent of the second light receiving element in the second period.

4. A mobile electronic device comprising the light receiver according to claim 3.

* * * * *